(12) United States Patent
Kudela et al.

(10) Patent No.: US 10,043,638 B2
(45) Date of Patent: Aug. 7, 2018

(54) COMPACT CONFIGURABLE MODULAR RADIO FREQUENCY MATCHING NETWORK ASSEMBLY FOR PLASMA PROCESSING SYSTEMS

(71) Applicant: Applied Materials, Inc., Santa Clara, CA (US)

(72) Inventors: Jozef Kudela, San Jose, CA (US); Ranjit I. Shinde, San Jose, CA (US); Suhail Anwar, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/815,945

(22) Filed: Jul. 31, 2015

(65) Prior Publication Data
US 2016/0049280 A1    Feb. 18, 2016

Related U.S. Application Data

(60) Provisional application No. 62/084,554, filed on Nov. 25, 2014, provisional application No. 62/037,917, filed on Aug. 15, 2014.

(51) Int. Cl.
*H01J 37/32* (2006.01)
*H03H 7/40* (2006.01)

(52) U.S. Cl.
CPC .. *H01J 37/32183* (2013.01); *H01J 37/32137* (2013.01); *H03H 7/40* (2013.01);
(Continued)

(58) Field of Classification Search
None
See application file for complete search history.

(56) References Cited

U.S. PATENT DOCUMENTS 5,304,961 A * 4/1994 Dydyk ............... H03H 7/48
                                                    333/112
5,383,019 A    1/1995 Farrell et al.
(Continued)

FOREIGN PATENT DOCUMENTS

EP        0825712      2/1998
EP        1056200     11/2000
(Continued)

OTHER PUBLICATIONS

International Search Report and Written Opinion of International Application No. PCT/US2015/043336 dated Nov. 13, 2015.
(Continued)

*Primary Examiner* — Douglas W Owens
*Assistant Examiner* — Srinivas Sathiraju
(74) *Attorney, Agent, or Firm* — Dugan & Dugan, PC

(57) ABSTRACT

A compact configurable radio frequency (RF) matching network for matching RF energy output from an RF generator to a variable impedance load is disclosed. The matching network includes an input connector; an output connector; and a component assembly array including one or more tune and load electrical components. At least one of the electrical components is coupled to the input connector, at least one of the electrical components is coupled to the output connector, the component assembly array is adapted to be arranged in a selected topology, and the selected topology is adapted to reduce RF energy reflected from the variable impedance load. Numerous other aspects are provided.

20 Claims, 22 Drawing Sheets

(52) U.S. Cl.
CPC ... *H01J 2237/002* (2013.01); *H01J 2237/332* (2013.01); *H01J 2237/334* (2013.01)

(56) References Cited

U.S. PATENT DOCUMENTS

| | | | | |
|---|---|---|---|---|
| 5,469,129 | A * | 11/1995 | Dydyk | H03H 7/48 333/100 |
| 5,481,231 | A * | 1/1996 | Dydyk | H03C 3/22 333/112 |
| 6,621,372 | B2 * | 9/2003 | Kondo | H01J 37/32082 333/17.3 |
| 6,703,080 | B2 * | 3/2004 | Reyzelman | H01J 37/32082 118/723 E |
| 6,816,029 | B2 * | 11/2004 | Choi | H01J 37/32183 333/32 |
| 6,824,305 | B1 * | 11/2004 | Boyd | G01K 17/00 374/15 |
| 6,855,225 | B1 * | 2/2005 | Su | H01J 37/32174 118/723 I |
| 7,518,466 | B2 * | 4/2009 | Sorensen | H01J 37/32082 333/17.3 |
| 7,868,556 | B2 * | 1/2011 | Xia | H01J 37/32082 315/111.21 |
| 8,334,657 | B2 * | 12/2012 | Xia | H01J 37/32082 315/111.51 |
| 2002/0130110 | A1 | 9/2002 | Kwon et al. | |
| 2003/0057844 | A1 | 3/2003 | Windhorn et al. | |
| 2003/0146803 | A1 | 8/2003 | Pickard et al. | |
| 2004/0027209 | A1 * | 2/2004 | Chen | H01J 37/32082 333/17.3 |
| 2007/0030091 | A1 * | 2/2007 | Xia | H01J 37/32082 333/17.3 |
| 2007/0046391 | A1 * | 3/2007 | Sorensen | H01J 37/32082 333/32 |
| 2008/0303608 | A1 | 12/2008 | Rector | |
| 2010/0206483 | A1 * | 8/2010 | Sorensen | H01J 37/32091 156/345.34 |
| 2011/0135844 | A1 * | 6/2011 | Sorensen | H01J 37/32091 427/578 |
| 2011/0309748 | A1 * | 12/2011 | Xia | H01J 37/32082 315/111.21 |

FOREIGN PATENT DOCUMENTS

| | | |
|---|---|---|
| EP | 1237189 | 9/2002 |
| KR | 10-2002-0039592 | 5/2002 |
| WO | WO 00/03415 | 1/2000 |

OTHER PUBLICATIONS

Anwar et al., of U.S. Appl. No. 14/815,947, titled: "Systems and Methods for Improved Radio Frequency Matching Networks," filed Jul. 31, 2015.

International Preliminary Report on Patentability of International Application No. PCT/US2015/043336 dated Mar. 2, 2017.

* cited by examiner

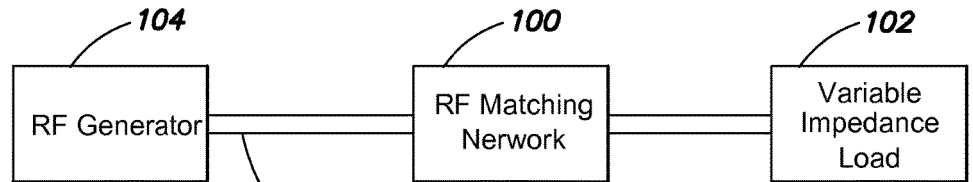
FIG. 1
(Prior Art)
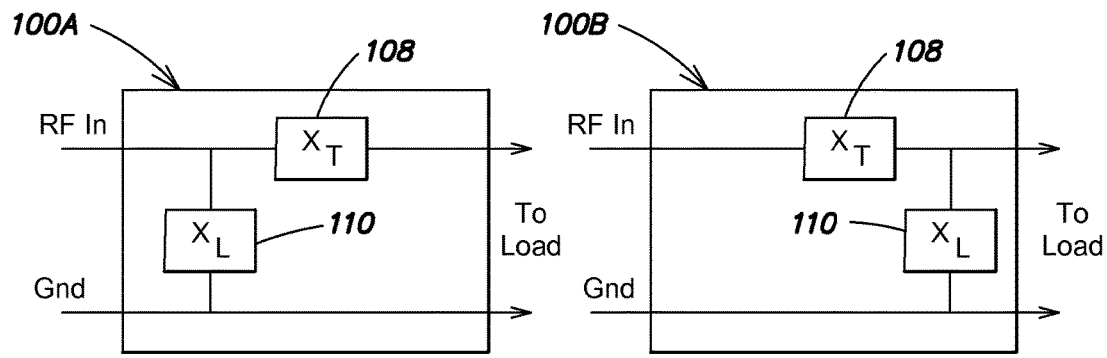
FIG. 2A
(Prior Art)
FIG. 2B
(Prior Art)
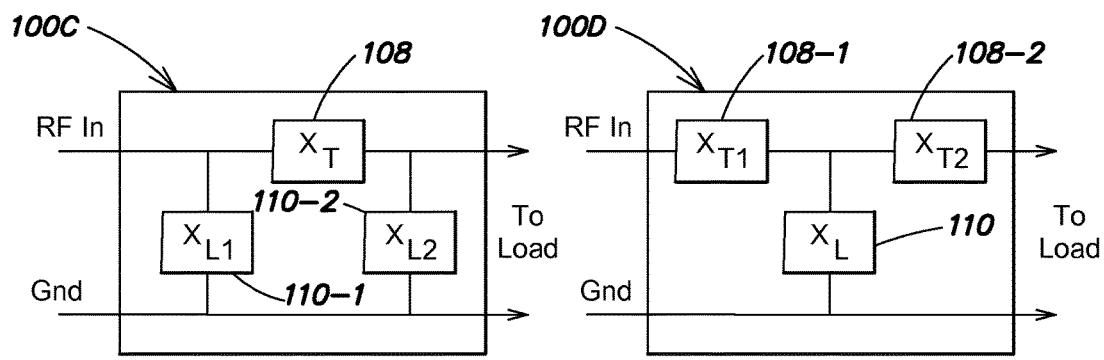
FIG. 2C
(Prior Art)
FIG. 2D
(Prior Art)

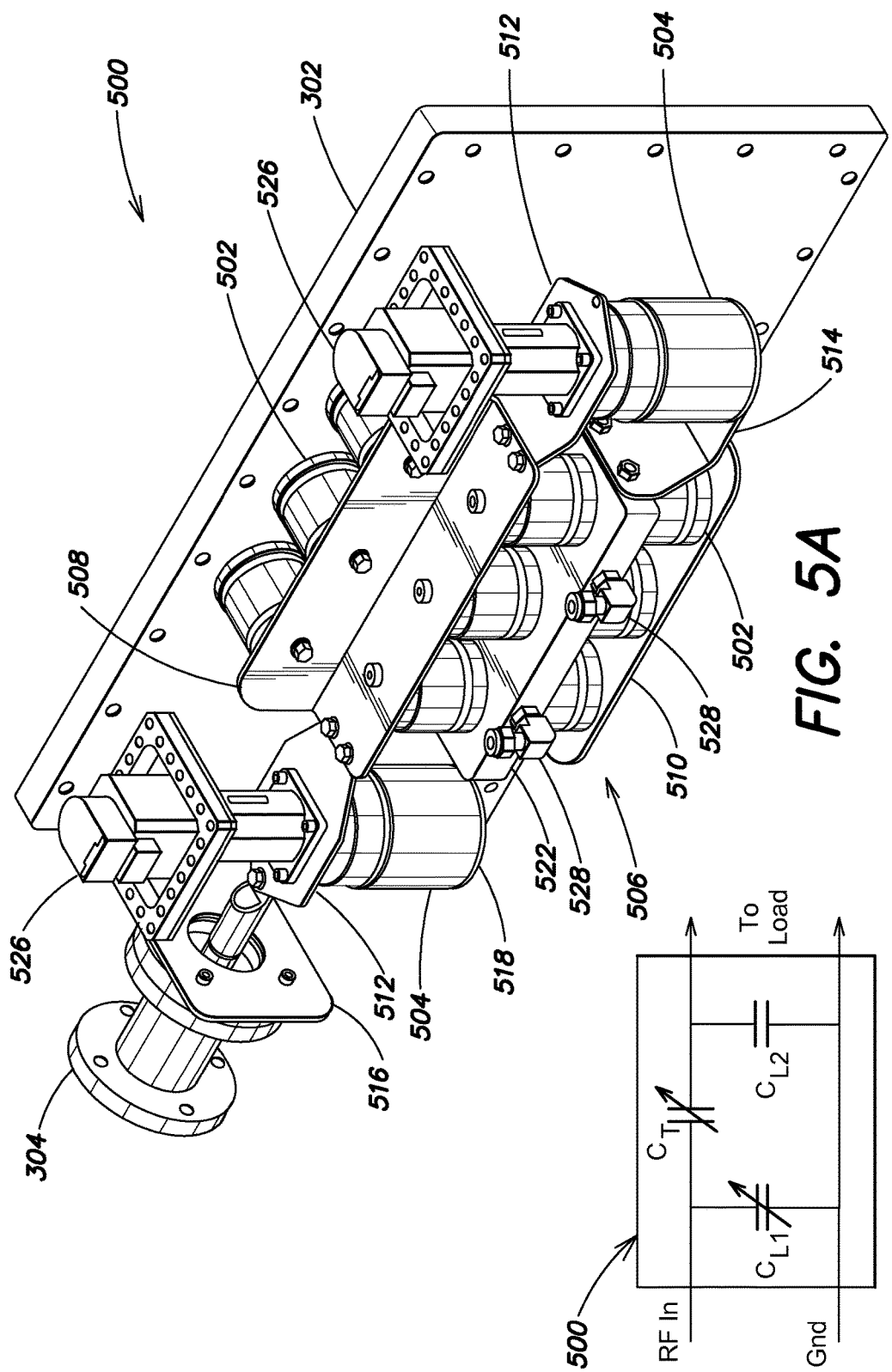

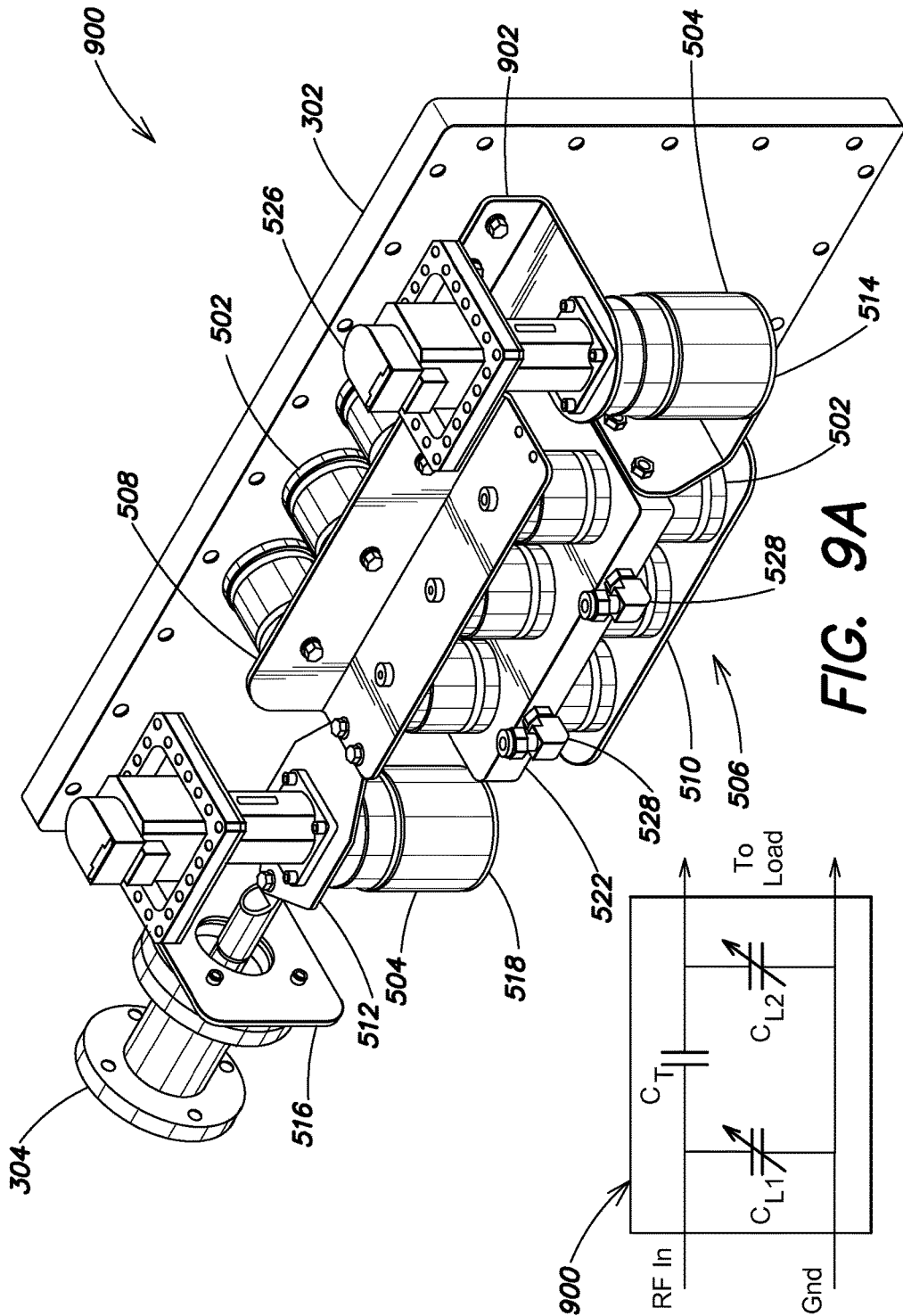

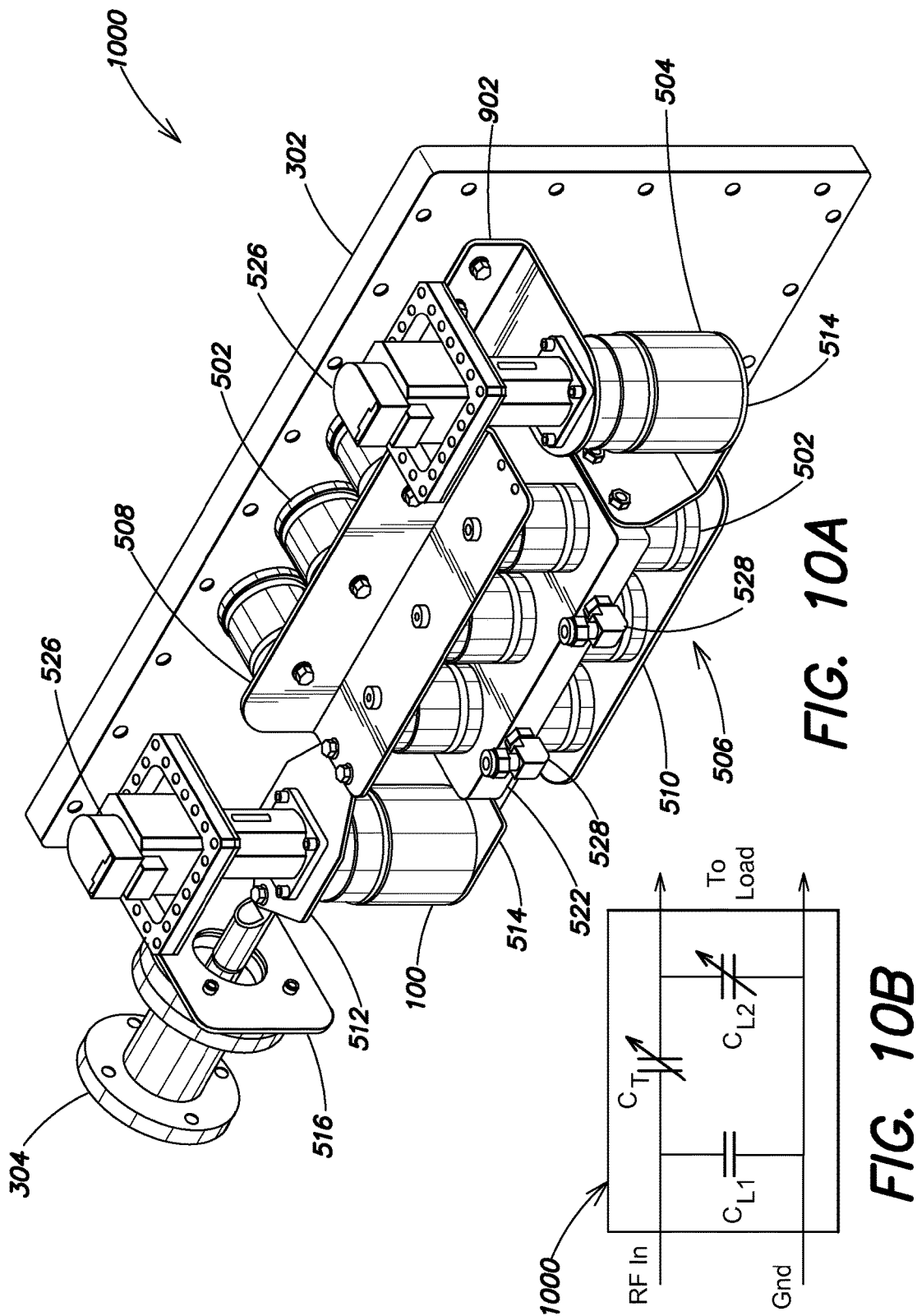

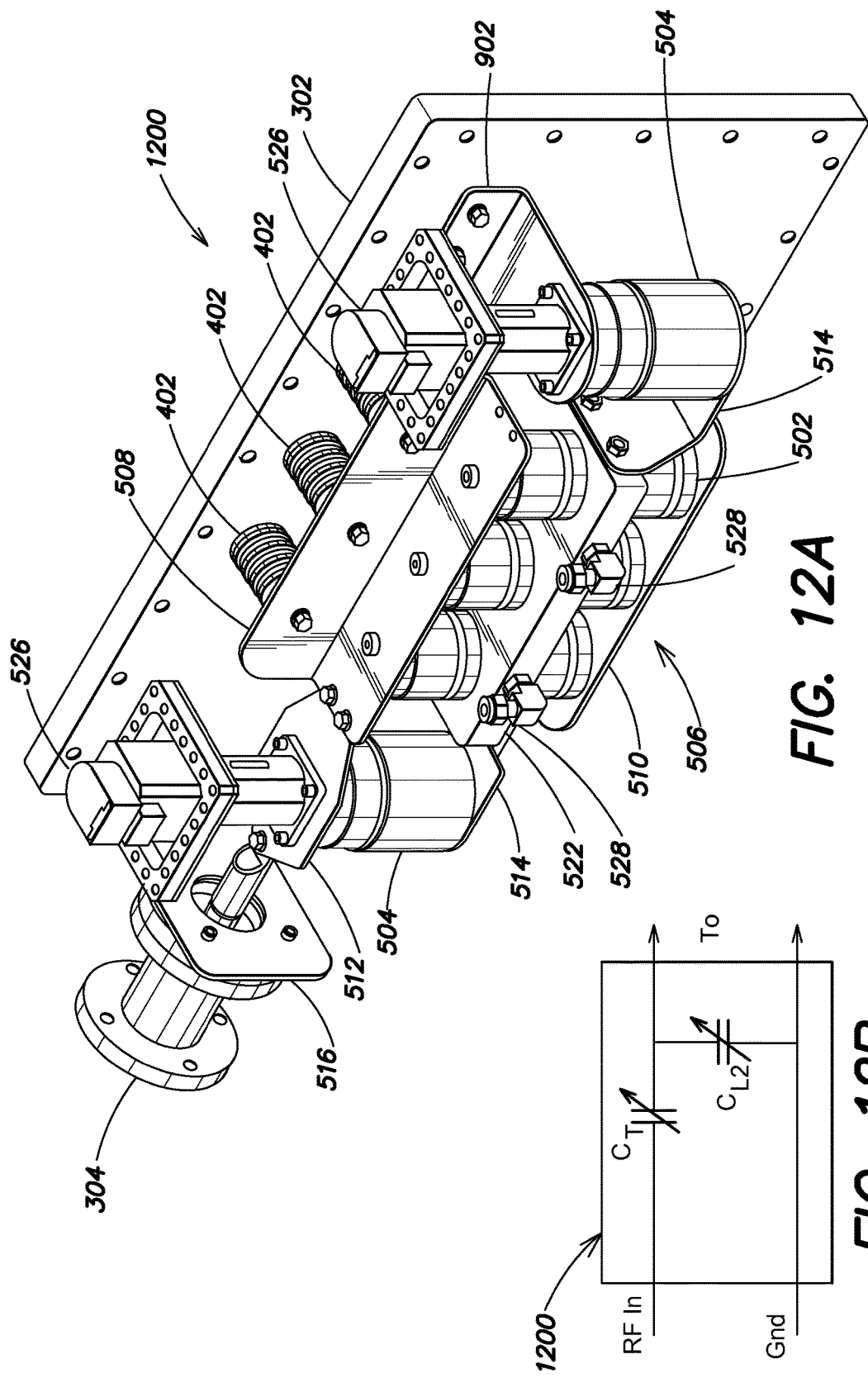

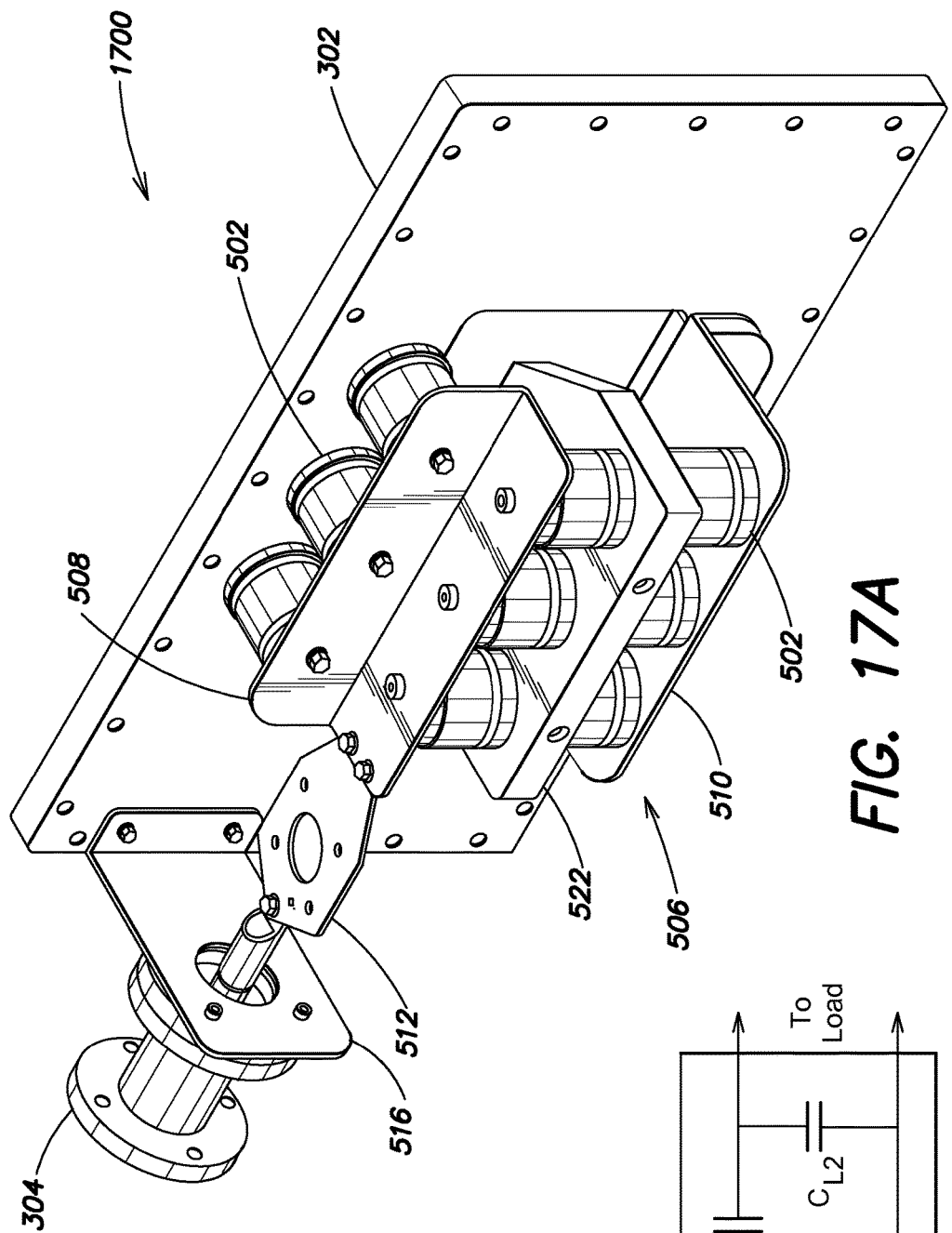
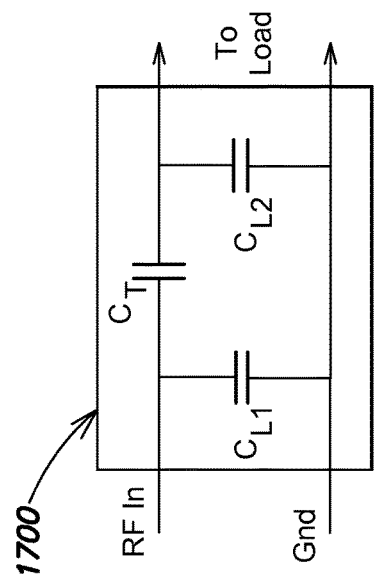
FIG. 17A
FIG. 17B

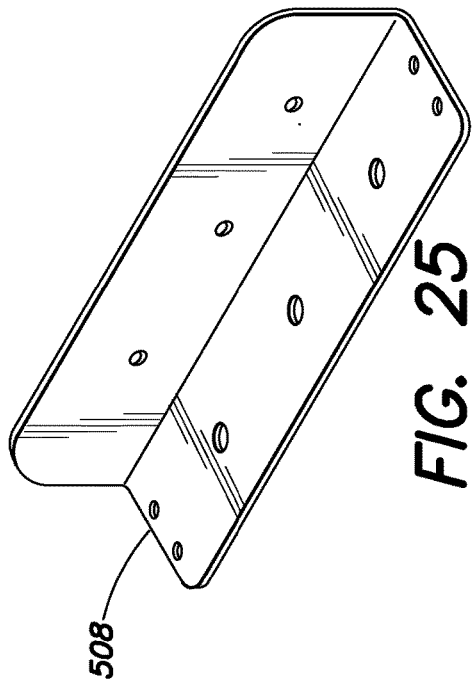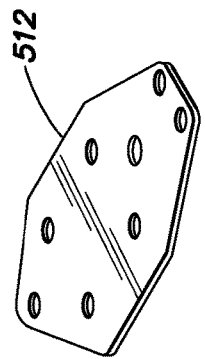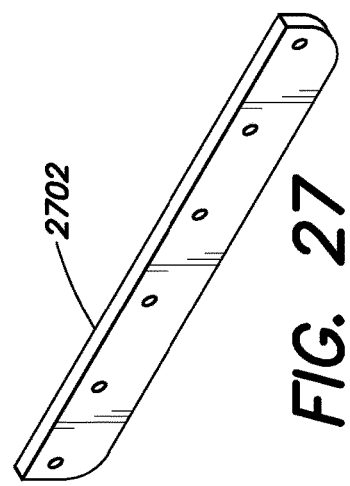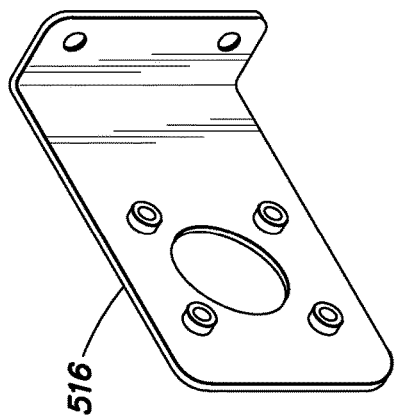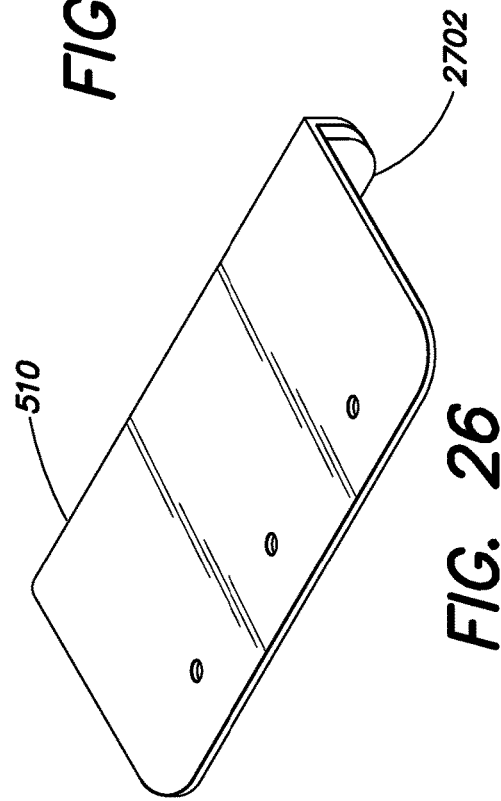

COMPACT CONFIGURABLE MODULAR RADIO FREQUENCY MATCHING NETWORK ASSEMBLY FOR PLASMA PROCESSING SYSTEMS

RELATED APPLICATIONS

The present application claims priority to U.S. Provisional Application No. 62/084,554 filed Nov. 25, 2014 and titled "IMPROVED RADIO FREQUENCY MATCHING NETWORKS", and U.S. Provisional Application No. 62/037,917 filed Aug. 15, 2014 and titled "SYSTEMS AND METHODS FOR IMPROVED RADIO FREQUENCY MATCHING NETWORKS", both of which are incorporated herein by reference in their entirety for all purposes.

FIELD

The present invention relates generally to radio frequency matching networks and specifically to high power matching networks for plasma processing systems.

BACKGROUND

Generally, matching networks include electrical components and circuitry selected and configured to match the output impedance of a power supply or generator to the input impudence of a load. Without a matching network, any difference between the output impedance and input impedance results in reflections or other disruptions in the electrical energy from the supply which can cause inefficiency in the power transfer, perturbations in the operation of the load, and if the difference is large enough, destruction of components in the system. Therefore, to maximize power transfer from a power generator to a load such as a plasma processing chamber, a matching network is typically used to prevent or at least reduce reflection of the electrical power signal due to an impedance mismatch between the generator and the load.

Referring to FIG. 1, a plasma processing system may include a high or radio frequency (hereinafter referred to as 'RF') matching network 100, a variable impedance load 102 (e.g. a plasma processing chamber), an RF generator 104, and an RF delivery system 106. The RF matching network 100 is disposed between and electrically coupled to the RF delivery system 106 and the variable impedance load 102. The RF delivery system 106 is electrically coupled to the RF generator 104. The RF matching network 100 may include electrical components typically with fixed impedance values (e.g., capacitors and/or inductors). The RF delivery system 106 may include items such as a high power coaxial cable assembly and connectors.

The RF generator 104 may provide RF energy to the variable impedance load 102 via the RF delivery system 106 and the RF matching network 100. The function of the RF matching network 100 may be to match the impedance of the variable impedance load 102 to the output impedance of the RF generator 104 and RF delivery system 106. By matching the impedance of the variable impedance load 102 to the output impedance of the RF generator 104 and the RF delivery system 106, the reflection of the RF energy from the variable impedance load 102 may be reduced. Reducing the reflection of RF energy may effectively increase the amount of RF energy provided to the variable impedance load 102 by the RF generator 104.

Conventional methods of RF matching include creating a matching network of lumped-elements or transmission lines, or combinations of both, depending on applied frequency and load-impedance values and/or range. In order to minimize losses in the matching network, elements with reactive impedances with low series resistance (i.e., high-Q), for example, capacitors, inductors, and/or low-loss transmission lines are typically used to match the variable impedance load to the output impedance of the RF generator. FIGS. 2A through 2D are more detailed schematic drawings depicting elements of the most common types of prior art matching networks 100A through 100D. The depictions show the arrangement of one or more tune components 108, 108-1, 108-2 and one or more load components 110, 110-1, 110-2 of four different types of network topologies of the RF matching networks 100A through 100D. More specifically, FIG. 2A depicts an L-type matching network including a tune component 108 in series with the load 102 and a load component 110 in parallel with the load 102 disposed between the generator 104 and the tune component 108. FIG. 2B depicts an inverse L-type network including a tune component 108 in series with the load 102 and a load component 110 in parallel with the load 102 disposed between the load 102 and the tune component 108. FIG. 2C depicts a Π-network including a tune component 108 in series with the load 102 and a first load component 110-1 disposed between the generator 104 and the tune component 108 and a second load component 110-2 disposed between the load 102 and the tune component 108, wherein both the first and second load components 110-1, 110-2 are in parallel with the load 102. FIG. 2D depicts a T-network that includes first and second tune components 108-1, 108-2 in series with the load 102 and a load component 110 in parallel with the load 102 and disposed between the first and second tune components 108-1, 108-2.

A second conventional method of matching the impedance of the variable impedance load 102 to the impedance of the RF generator 104 may utilize variable frequency matching. The impedance presented by the RF matching network 100 to the output of the variable RF frequency generator 104 may change with the frequency. By outputting a particular frequency from the RF generator 104, the variable impedance load 102 may match the impedance of the RF generator 104 and the RF delivery system 106. This technique may be referred to as variable frequency matching. Variable frequency matching may employ an RF matching network 100 that includes fixed value tune components 108 and load components 110 (e.g. fixed value capacitors, inductors and/or resistors). The values of the tune components 108 and load components 110 may be selected to help ensure that the impedance of the RF generator 104 will match the impedance of the variable impedance load 102.

Prior art RF matching networks may help reduce the amount of energy reflected by the variable impedance load. However, the inventors of the present invention have determined that in some circumstances, existing RF matching networks do not provide the flexibility to be easily and cost effectively reconfigured to handle matching different loads at different power levels. Thus, what are needed are improved methods and apparatus for RF matching.

SUMMARY

In some embodiments, the present invention provides a radio frequency (RF) matching network assembly for matching RF energy output from an RF generator to a plasma chamber with a variable impedance load. The RF matching network assembly includes an input connector; an output connector; and a compact configurable component assembly array including one or more tune and load electrical components. At least one of the electrical components is coupled to the input connector, at least one of the electrical components is coupled to the output connector, the component assembly array is adapted to be arranged in a plurality of network topologies using a fixed number of buses and configurable connectors, the network topologies including a selected network topology, and the selected network topology is adapted to reduce RF energy reflected from the variable impedance load.

In some other embodiments, a plasma processing system is provided. The system includes an RF generator; an impedance match network assembly coupled to the RF generator; and a plasma chamber with a variable impedance load coupled to the impedance match network assembly. The impedance match network assembly includes an input connector, an output connector, and a compact configurable component assembly array including one or more tune and load electrical components. At least one of the electrical components is coupled to the input connector, at least one of the electrical components is coupled to the output connector, the component assembly array is adapted to be arranged in a plurality of network topologies using a fixed number of buses and configurable connectors, the network topologies including a selected network topology, and the selected network topology is adapted to reduce RF energy reflected from the variable impedance load.

In yet other embodiments, a method of matching RF energy output from an RF generator to a plasma chamber with a variable impedance load is provided. The method includes receiving RF power at an input connector; applying the RF power to a compact configurable component assembly array including one or more tune and load electrical components; outputting the RF power to the plasma chamber via an output connector with an impedance that matches the variable impedance load of the plasma chamber, wherein at least one of the electrical components is coupled to the input connector, at least one of the electrical components is coupled to the output connector; and arranging the component assembly array in a selected network topology configuration selected from among a plurality of possible network topology configurations, all of which can be assembled using the component assembly array. The selected network topology configuration is adapted to reduce RF energy reflected from the variable impedance load.

Other features and aspects of the present invention will become more fully apparent from the following detailed description, the appended claims, and the accompanying drawings.

BRIEF DESCRIPTION OF THE DRAWINGS

FIG. 1 is a block diagram depicting a prior art RF power system with an RF generator, an RF matching network, and a variable impedance load.

FIGS. 2A though 2D are schematic drawings illustrating details of four common types of prior art RF matching networks usable in the system of FIG. 1.

FIG. 5A is a perspective view of a first example configuration of a compact configurable impedance matching network assembly according to embodiments of the present invention.

FIG. 5B is a schematic diagram of the first example configuration of FIG. 5A.

FIG. 9A is a perspective view of a second example configuration of a compact configurable impedance matching network assembly according to embodiments of the present invention.

FIG. 9B is a schematic diagram of the second example configuration of FIG. 9A.

FIG. 10A is a perspective view of a third example configuration of a compact configurable impedance matching network assembly according to embodiments of the present invention.

FIG. 10B is a schematic diagram of the third example configuration of FIG. 10A.

FIG. 12A is a perspective view of a fifth example configuration of a compact configurable impedance matching network assembly according to embodiments of the present invention.

FIG. 12B is a schematic diagram of the fifth example configuration of FIG. 12A.

FIG. 17A is a perspective view of an eighth example configuration of a compact configurable impedance matching network assembly according to embodiments of the present invention.

FIG. 17B is a schematic diagram of the eighth example configuration of FIG. 17A.

FIG. 24 is a perspective view of an example ground shield connector of a configurable impedance matching network assembly according to embodiments of the present invention.

FIG. 25 is a perspective view of an example first bus of a configurable impedance matching assembly network according to embodiments of the present invention.

FIG. 26 is a perspective view of an example second bus of a configurable impedance matching network assembly according to embodiments of the present invention.

FIG. 27 is a perspective view of an example reinforcement bracket of a configurable impedance matching network assembly according to embodiments of the present invention.

FIGS. 28 to 32 are perspective views of example first through fifth configurable connectors of a configurable impedance matching network assembly according to embodiments of the present invention.

DESCRIPTION

Maximum power transfer between source RF energy and a load is achieved via impedance matching. Unmatched RF circuits result in reflected power. Standing waves on the transmission line between the source and load result from reflected power and based on the phase between the forward and reflected waves, these waves can add or subtract from each other. As a result, there can be points on the transmission line where the voltage is doubled and eventually points where the voltage equals zero (i.e., maximum current). If a standing wave is positioned on a transmission line so that the maximum voltage or current is applied to certain electrical components, the components can be destroyed.

New, larger plasma processing chambers are being developed to accommodate larger substrates. Larger plasma processing chambers use larger amounts of power to perform the requisite processing steps (e.g., etch, deposition and/or implant). In addition, the development of new processing techniques has resulted in much wider variations in the power requirements and impedance loads within processing recipes. The inventors of the present invention have determined that the increase in RF power and wider variations in impedance loads are not being adequately accommodated by conventional RF matching networks.

Conventionally, high-powered match networks offered a limited tuning space. Embodiments of the present invention provide a match network kit with a much broader tuning space range as well as a configurable network topology in a compact form factor.

Figure 3:
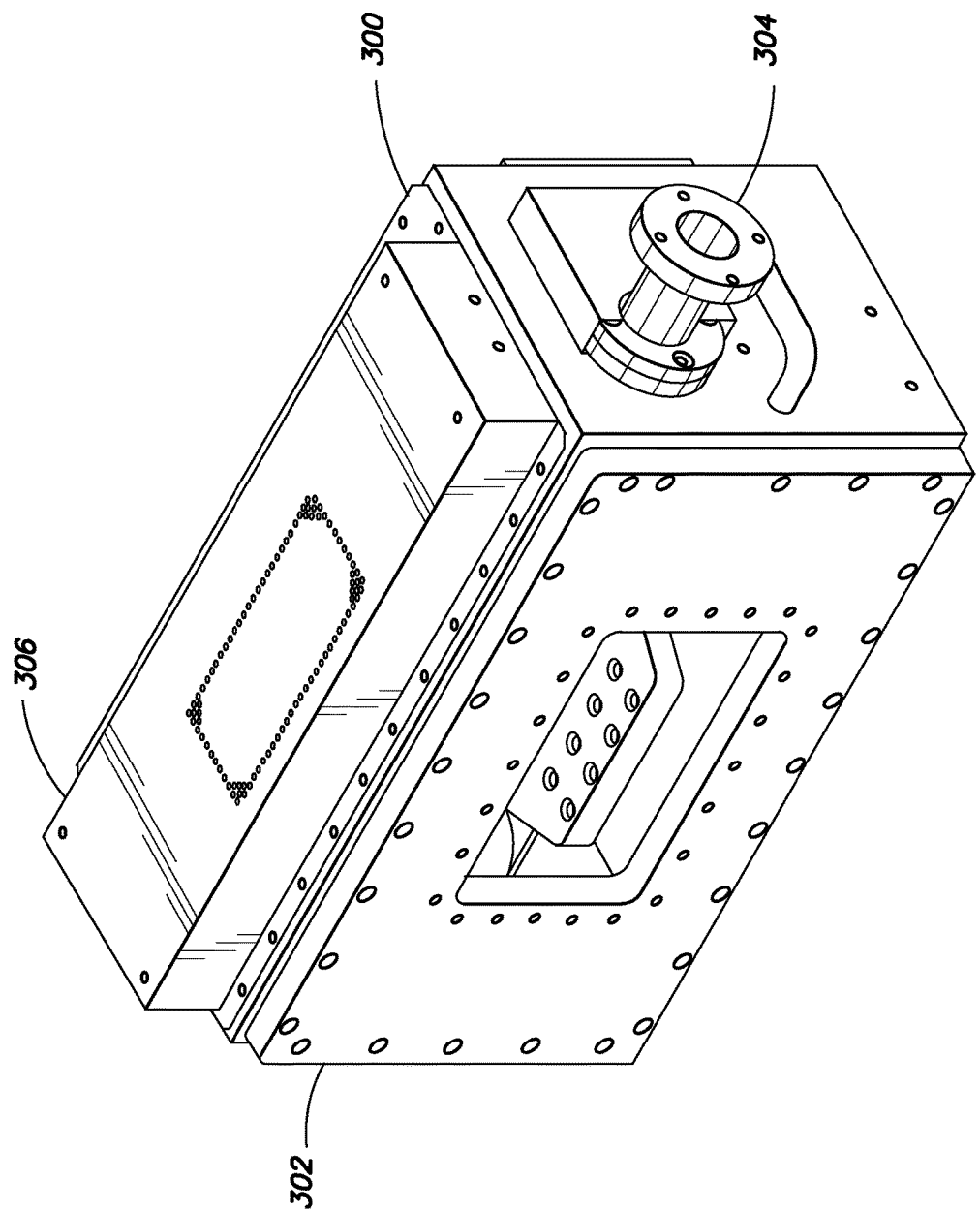
FIG. 3 is a perspective view of an output side of an example compact configurable impedance matching network assembly in an example housing according to embodiments of the present invention.
Figure 4A:
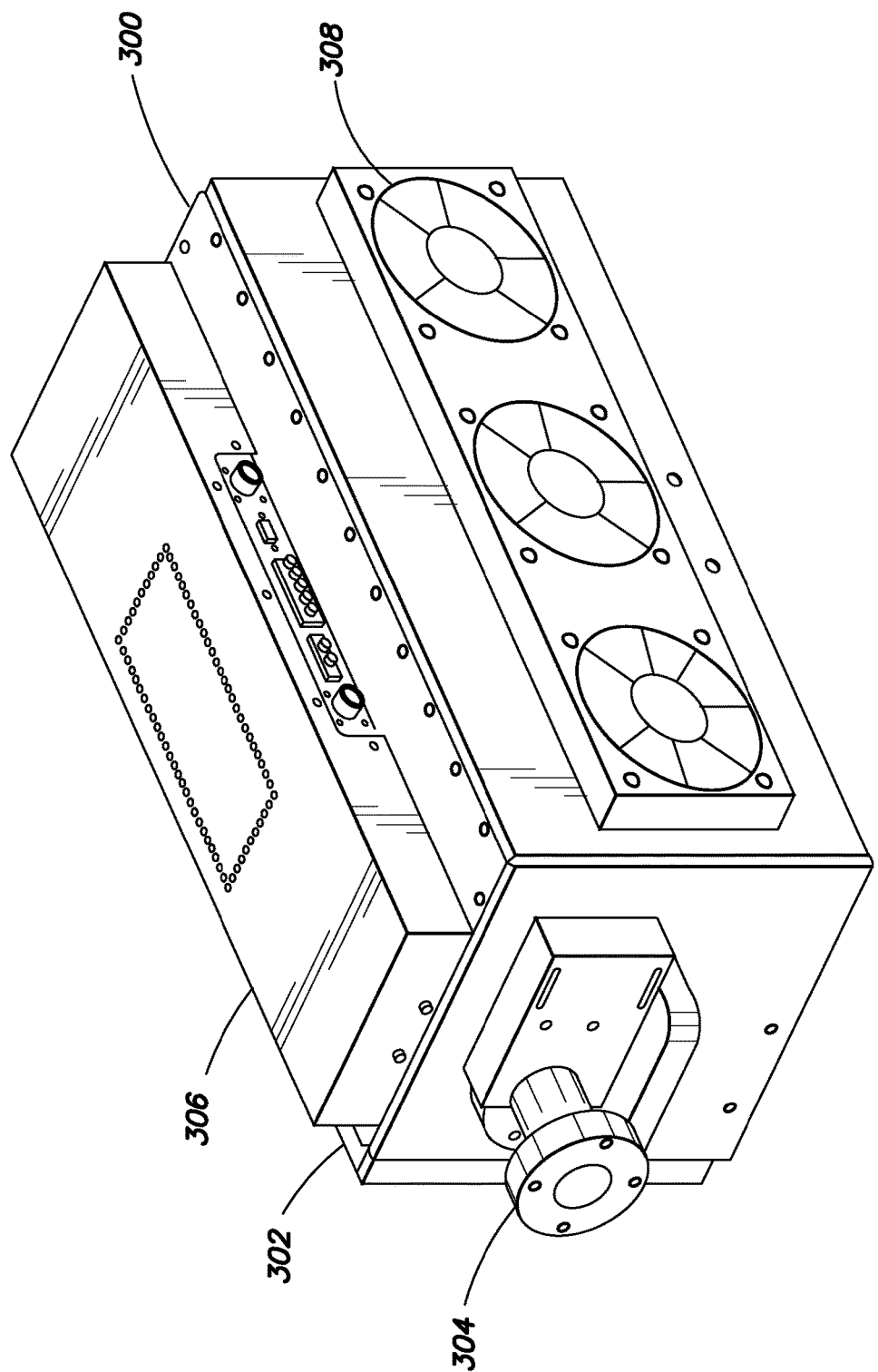
FIG. 4A is a perspective view of an opposite side of the example compact configurable impedance matching network assembly in the example housing of FIG. 3 showing an example input connector end.
Figure 4B:
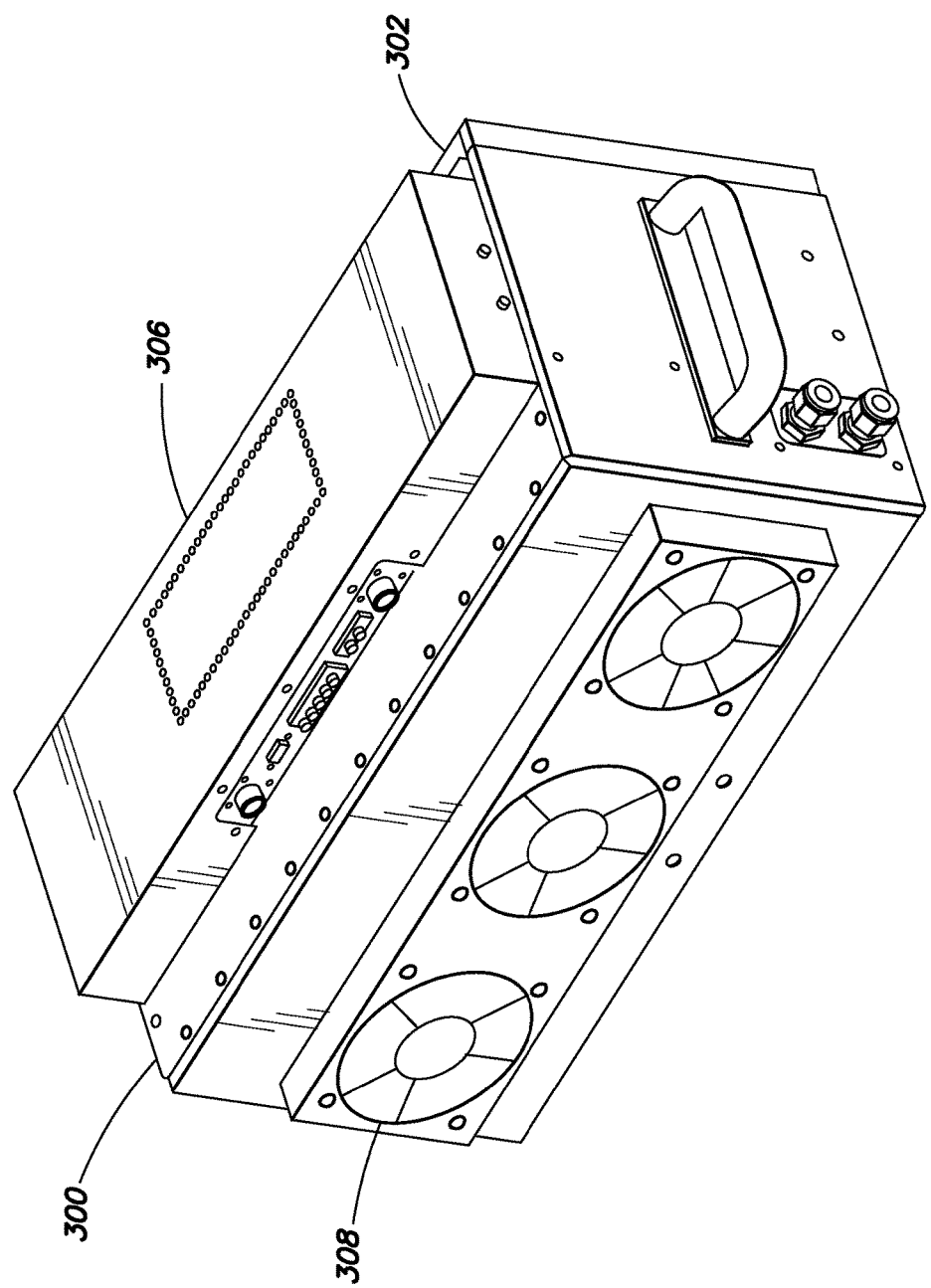
FIG. 4B is a perspective view of an opposite end of the example compact configurable impedance matching network assembly of FIG. 4A.

FIGS. 3, 4A and 4B depict views of an example enclosure 300 suitable for use with the various different configurations of match network assemblies of embodiments of the present invention. Note that in all the embodiments, the parts mounted on the output back plate 302 (which serves as a frame/holder of the body of the match network assembly and also as a heat dissipation/cooling plate), the connectors, and the RF-input connector 304 (e.g., an Electronic Industries Alliance (EIA) 1⅝" 50-Ohm coaxial interface) can be swapped or reversed from the left and right sides and/or rotated as needed to accommodate many different plasma chamber (i.e., load) configurations. The compact design also supports configurations where the layout includes the match network assembly and the RF generator disposed on the lid of the plasma chamber.

In some embodiments, the enclosure 300 can include a controller compartment 306 that includes one or more controllers (e.g., processors) and associated circuitry for operating actuators and other devices within the match network assembly. For example, stepper motors for adjusting the match network assembly's electrical components (e.g., variable capacitors), other controllers, and related electronics can be housed in the controller compartment 306. Further, one or more fans 308 can be mounted on the enclosure 300 that are operated by the controllers. Similarly, one or more pumps can be included in the enclosure 300 that are operated by the controllers. Further, one or more sensors (e.g., heat, humidity, etc.) can be included in the enclosure 300 and be operatively coupled to the controllers to detect when, for example, additional cooling is required or other status changes occur.

The example embodiment depicted in FIGS. 3, 4A and 4B illustrates the compactness of the configurable match network assembly. For example, a match network assembly with an RF output rated for 600 A rms and 10 kVp at 13.56 MHz, and an RF input that can handle RF powers of up to 40 kW at 13.56 MHz, the depicted embodiment can be implemented in an enclosure 300 that is approximately 21 inches long, approximately 11 inches deep, and approximately 14 inches high. Other dimensions are possible. Further, both the RF output and input can be modified according to preferred interface and/or power requirements. In some embodiments, inductive loads at approximately 13.5 MHz+/− 1 MHz can be used. These loads can also be used at lower or higher frequencies, for example, from approximately 2 MHz up to approximately 60 MHz.

Figure 6:
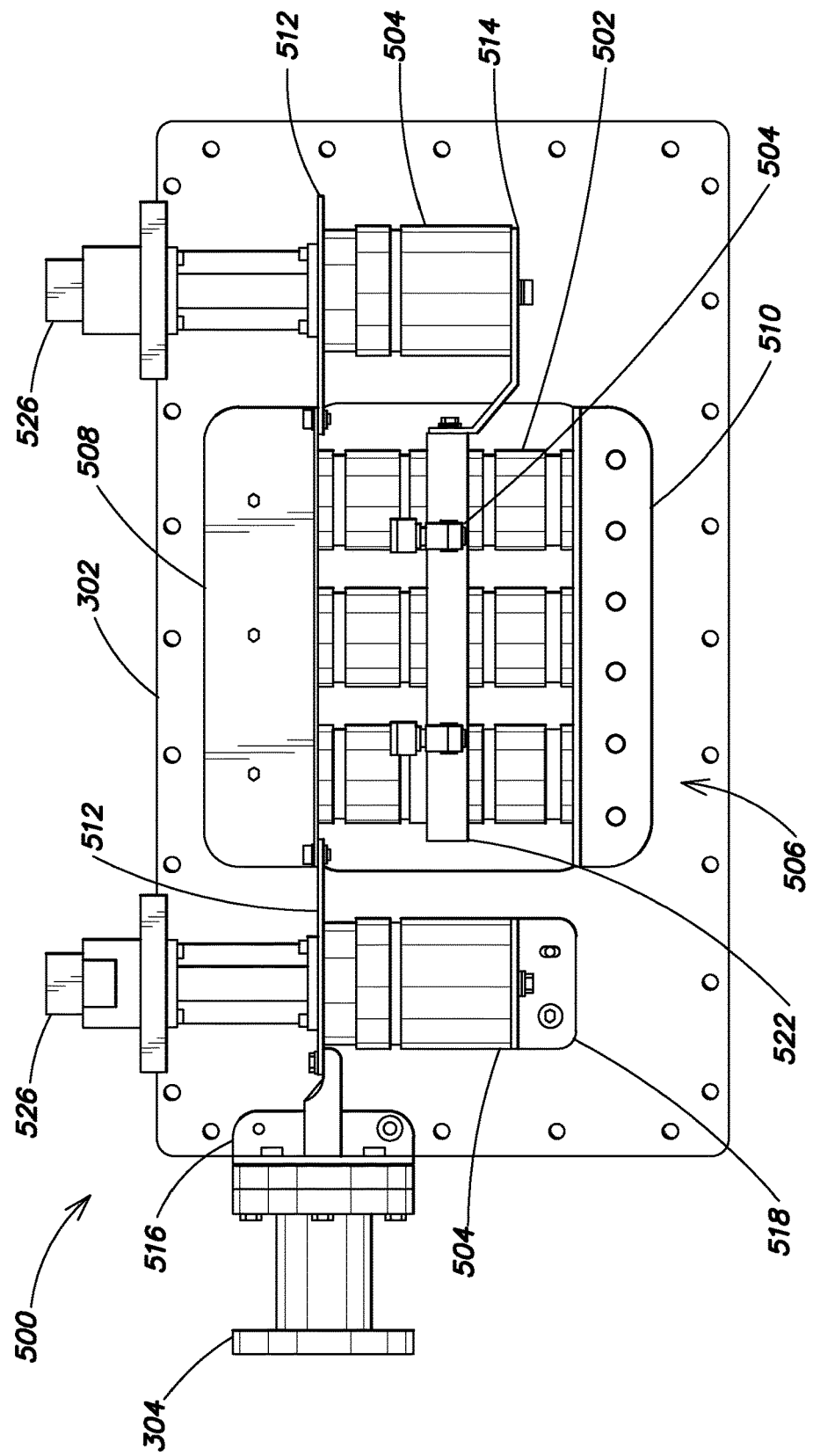
FIG. 6 is an elevation view of the first example configuration of FIG. 5A.

In accordance with embodiments of the present invention, an example of an inventive compact configurable RF matching network assembly 500 that includes a plurality of fixed impedance components 502 and optional variable impedance components 504 is depicted in FIGS. 5A, 5B, and 6. The components 502, 504 (e.g., capacitors) are disposed in a compact component assembly array 506 adjacent and electrically coupled to a plurality of conductive buses 508, 510. Also coupled to the conductive buses 508, 510 are a configurable set of connectors 512, 514, 516, 518 that allow the buses 508, 510, a high power RE-input connector 304, an RF output strap 522, and an output back plate 302 to be easily coupled/decoupled from each other. These modular elements allow the components 502, 504 and conductive buses 508, 510 to be coupled together in different network topologies (e.g., L, inverse-L, T, Π, etc.). For example, the particular configuration shown in FIG. 5A forms a "Π" network topology as most clearly illustrated in FIG. 5B.

In some embodiments, actuators 526 are provided to control the variable impedance components 504. The actuators 526 allow a processing controller (not shown in FIG. 5A) to adjust the impedance of the variable impedance components 504. The actuators 526 can be embodied using servo-motors but in some embodiments can include any practicable actuators such as other types of electric motors, hydraulic drivers, pneumatic cylinders, electronic solenoids, and the like or any combination thereof. In some embodiments, components that include integrated actuators can be used. For example, servo-motor controlled variable capacitors can be used for the variable impedance components 504.

In some embodiments, the components 502, 504 can be coupled to and decoupled from the network by physically displacing them from the buses 508, 510 or by physically displacing one bus 508 from another. For example, a component 502 can be released or disconnected from the bus 510 and replaced with a non-conductive spacer or insulator. Note that the components 502, 504 can be coupled to the buses 508, 510 and connectors 508, 510, 512, 514, 518 using removable fasteners such as bolts and nuts. Any number of other practicable fasteners can be used. Further note that the components 502, 504 (e.g., capacitors) are disposed in a compact component assembly array 506 immediately adjacent the conductive buses 508, 510 and in close proximity to each other, thereby minimizing the length of the RF current paths and minimizing the series resistance and series inductance.

As also shown in the embodiment of FIG. 5A, arrangements may be provided to cool the RF matching network assembly 500 to prevent any overheating which may occur. Cooling may be provided by forming a fluid reservoir and channels within the body of the RF output strap 522. Note that input and output cooling fluid channels 528 are shown. Further note that these fluid channels 528 can be coupled to cooling fluid input and output connectors on the enclosure 300 (FIG. 3). In addition, a ported or vented enclosure (not shown in FIG. 5A but see FIG. 4A) that includes one or more fans 308 can be used to further dissipate heat along with an increased thickness output back plate 302. In some embodiments, the output back plate 302 can include cooling fluid channels.

A notable feature of the match network assembly 500 depicted in FIG. 5A (and common to all the configuration embodiments described below) is that the entire match network assembly 500 sits on a thick metal plate (i.e., the output back plate 302) which serves as output ground (or RF return), with all critical match network elements and components physically proximate to the RF output. This configuration minimizes internal series resistance and inductance of the match network assembly 500, i.e., it minimizes losses and voltages at the RF output. The "bulky" metal output back plate 302 also serves as cooling plate for the components 502, 504. As mentioned above, in some embodiments, the output back plate 302 can optionally be fluid cooled.

The configurable match network assembly 500 depicted in FIGS. 5A, 5B, and 6 is shown in the Π network topology for inductive loads. This first example configuration includes three banks of fixed capacitors ($C_{L1}$, $C_T$, and $C_{L2}$), each including up to three capacitors and two variable capacitors in the $C_{L1}$ and $C_T$ capacitor-banks. As will be described in more detail below, by moving and/or replacing some of the components 502, 504 within the match network assembly 500, the RF input, network topology, and/or equivalent circuit can be easily changed. In other words, the match network assembly 500 of embodiments of the present invention is easily, quickly, and cost effectively re-configurable.

Figures 7A, 7B:
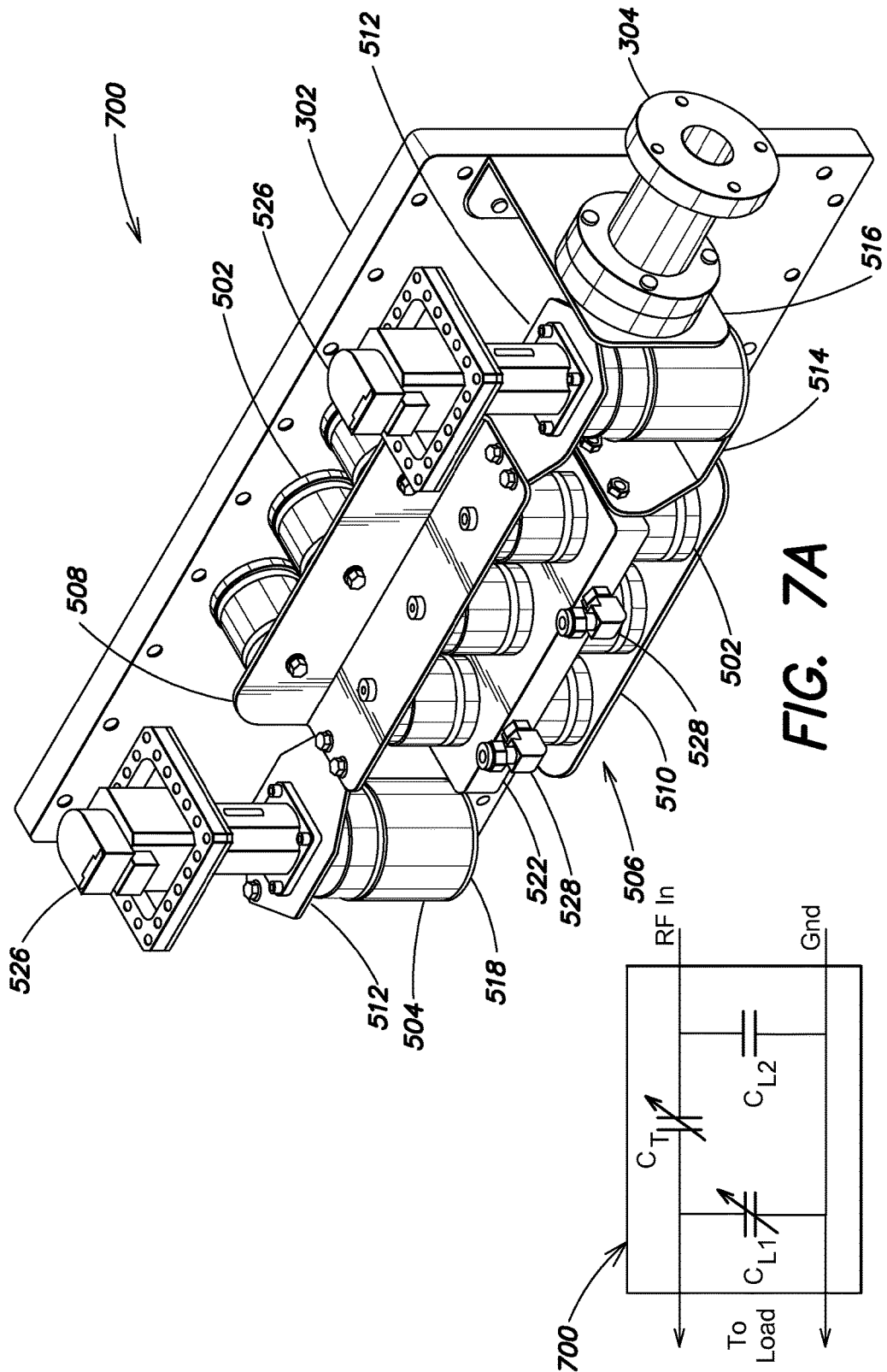
FIG. 7A is a perspective view of a "mirror-image" example configuration of the first example configuration shown in FIG. 5A according to embodiments of the present invention.
FIG. 7B is a schematic diagram of the mirror-image example configuration of FIG. 7A.
Figure 8:
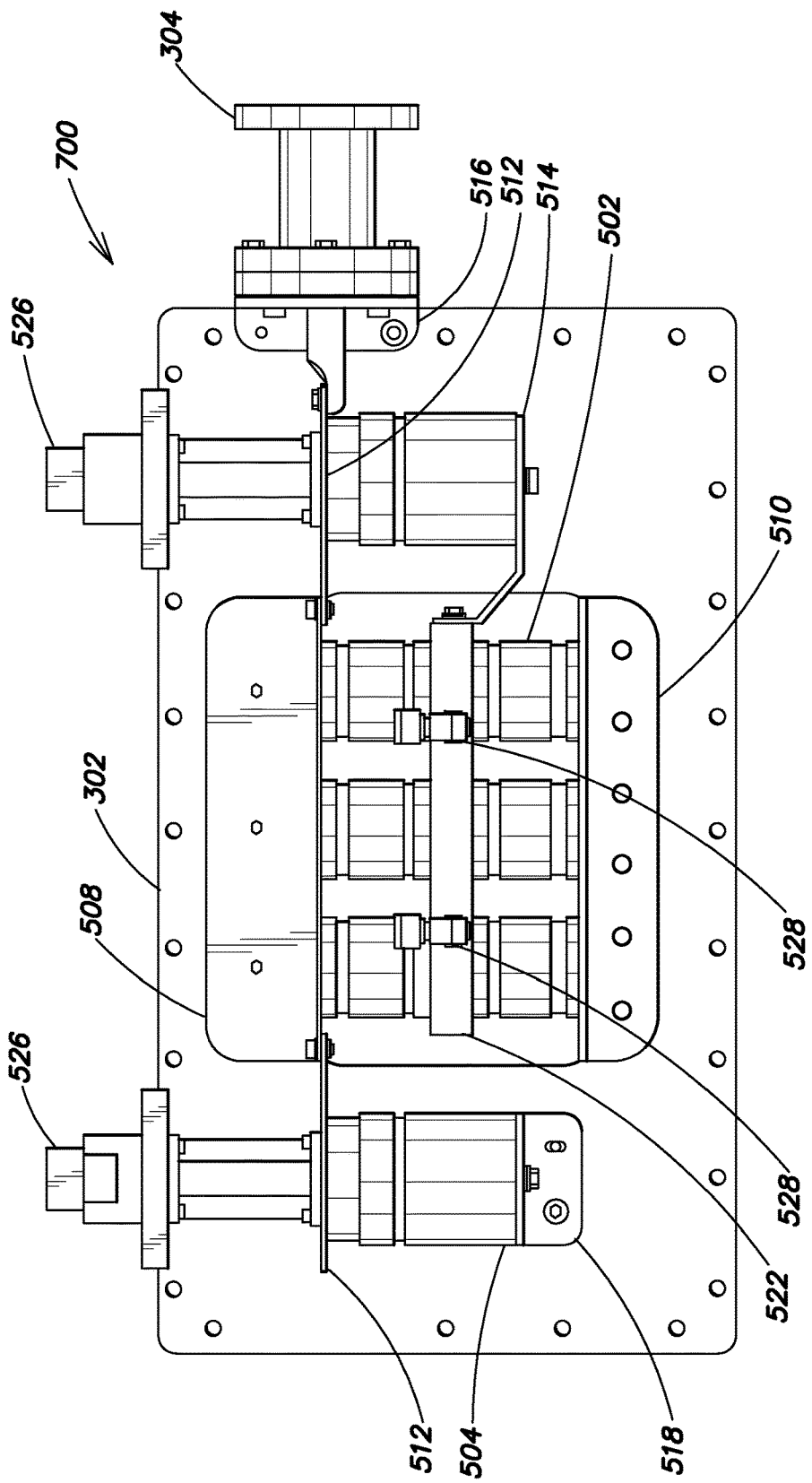
FIG. 8 is an elevation view of the mirror-image example configuration of FIG. 7A.

Turning now to FIGS. 7A, 7B, and 8, a second example configuration of the match network assembly 700 is shown that illustrates the flexibility and configurability of embodiments of the present invention. Match network assembly 700 includes the same parts (e.g., components 502, 504, buses 508, 510 and connectors 512, 514, 516, 518) as match network assembly 500 of FIGS. 5A, 5B, and 6, but the RF-input connector 304 has been changed from the left side of the match network assembly to the right side. The network topologies are the same in the two match network assemblies but the RF-input side is different (e.g., for convenience or necessity) to better support connection to the generator 104 and/or load 102. This feature of embodiments of the present invention originates from the symmetric layout of the overall match network assembly design.

Turning now to FIGS. 9A and 9B, a third example configuration of the match network assembly 900 is shown that further illustrates the flexibility and configurability of embodiments of the present invention. The match network assembly 900 is configured in a Π network topology similar to the configuration shown in FIGS. 5A, 5B, and 6, but with a different combination and arrangement of variable capacitors. In particular, $C_{L2}$ (FIG. 9B) which was a fixed capacitor has been replaced with a variable capacitor and $C_T$ which was a variable capacitor has been replaced with a fixed capacitor. In other words, both the load capacitors $C_{L1}$ and $C_{L2}$ are now variable capacitors while the tune capacitor $C_T$ has been changed to a fixed capacitor. Unlike conventional match networks that would require expensive component and wiring changes (if possible at all), this change can be easily, quickly, and cost effectively made in the field by merely changing the top connector 512 on the variable component 504 on the right hand side of the match network assembly 900 to connect to the output back plate 302 instead of the bus 508. Such a "circuit change" allows shifting or stretching of the match network assembly tuning space to accommodate particular given loads (e.g., the required range or spectrum of load impedances for a particular process recipe).

Turning now to FIGS. 10A and 10B, a fourth example configuration of the match network assembly 1000 is shown that further illustrates the flexibility and configurability of embodiments of the present invention. The match network assembly 1000 is configured in a Π network topology similar to the configuration shown in FIGS. 9A and 9B, but with a different combination and arrangement of variable capacitors. In particular, load component $C_{L1}$ (FIG. 10B) which was a variable capacitor has been replaced with a fixed capacitor and tune component $C_T$ which was a fixed capacitor has been replaced with a variable capacitor. In other words, the position of the variable load component has been swapped with the position of the fixed tune component as compared to the configuration shown in FIGS. 9A and 9B. Unlike conventional match networks that would require expensive component and wiring changes (if possible at all), this change can be easily, quickly, and cost effectively made in the field by merely changing the bottom connector 518 on the variable component 504 on the left hand side of the match network assembly 1000 to connect to the bus 510 instead of the output back plate 302. As before, such a circuit change effectively allows shifting or stretching of the match network assembly tuning space to accommodate particular given loads (e.g., the required range or spectrum of load impedances for a particular process recipe).

Figures 11A, 11B:
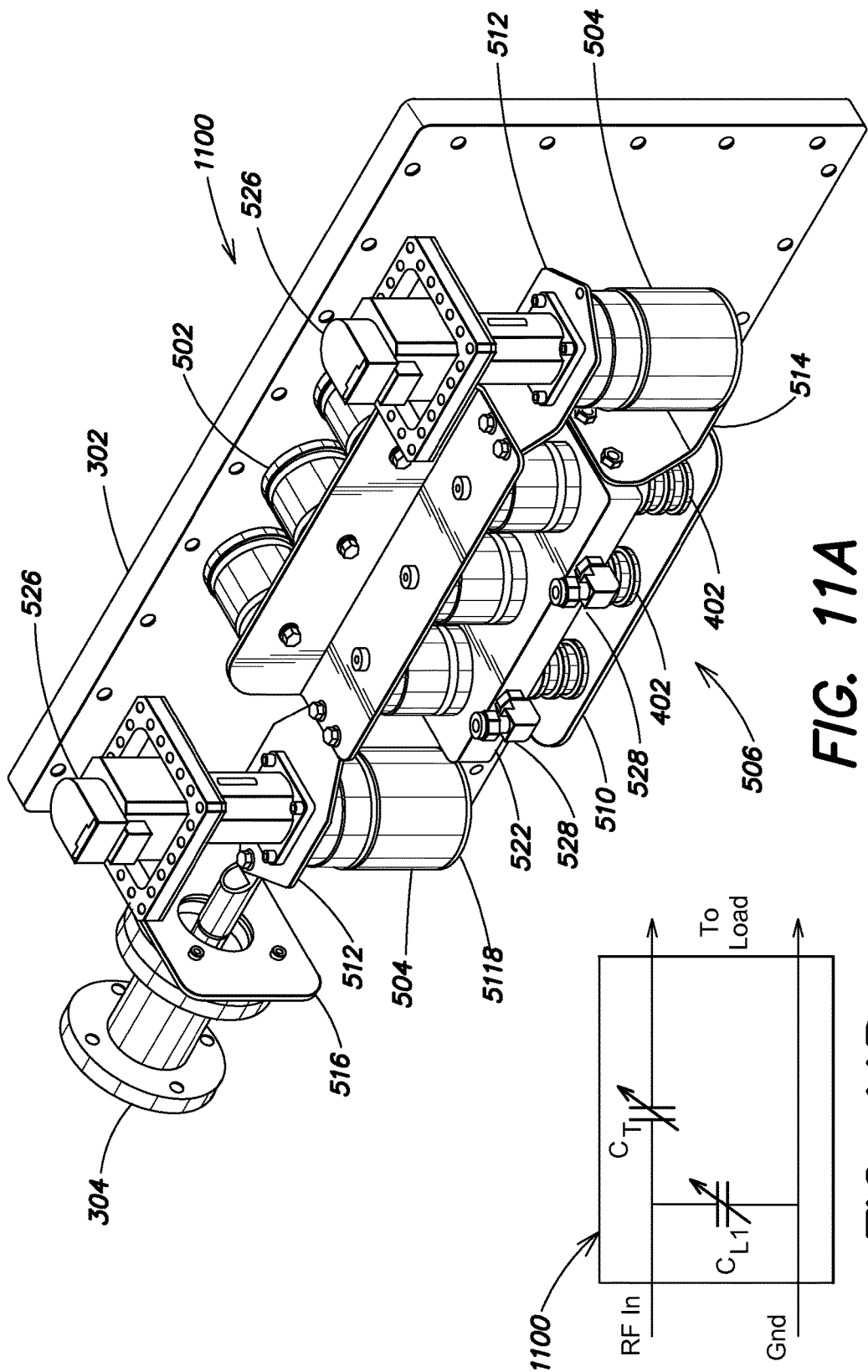
FIG. 11A is a perspective view of a fourth example configuration of a compact configurable impedance matching network assembly according to embodiments of the present invention.
FIG. 11B is a schematic diagram of the fourth example configuration of FIG. 11A.

Turning now to FIGS. 11A and 11B, a fifth example configuration of the match network assembly 1100 is shown that further illustrates the flexibility and configurability of embodiments of the present invention. The match network assembly 1100 is configured in an L network topology with variable load and tune capacitors. Note that this is a different network topology than the Π network of, for example, the configuration shown in FIGS. 5A, 5B, and 6. In particular, the fixed load component $C_{L2}$ has been eliminated from the circuit. Unlike conventional match networks that would require expensive component and wiring changes (if possible at all), this change from a Π network to an L network can be easily, quickly, and cost effectively made in the field by merely replacing the fixed components 502 that were attached to bus 510 with insulators 402. Note however that the use of the insulators 402 in this embodiment is optional and they are used merely to maintain mechanical strength of the match network assembly. As before, such a circuit change effectively allows shifting or stretching of the match network assembly tuning space to accommodate particular given loads (e.g., the required range or spectrum of load impedances for a particular process recipe).

Turning now to FIGS. 12A and 12B, a sixth example configuration of the match network assembly 1200 is shown that further illustrates the flexibility and configurability of embodiments of the present invention. The match network assembly 1200 is configured in an inverse-L network topology with variable load and tune capacitors. Note that this is a different network topology than the Π network of, for example, the configuration shown in FIGS. 5A, 5B, and 6. In particular, the variable load capacitor $C_{L1}$ has been eliminated from the circuit and the fixed load capacitor $C_{L2}$ has been changed to a variable capacitor. Unlike conventional match networks that would require expensive component and wiring changes (if possible at all), this change from a Π network to an inverse-L network can be easily, quickly, and cost effectively made in the field by merely (a) replacing the fixed components 502 that were attached to bus 508 with insulators 402; (b) changing the bottom connector 518 on the variable component 504 on the left hand side of the match network assembly 1200 to connect to bus 510 instead of the output back plate 302; and (c) changing the top connector 512 on the variable component 504 on the right hand side of the match network assembly 1200 to connect to the output back plate 302 instead of the bus 508. Note however that the use of the insulators 402 in this embodiment is optional and they are used merely to maintain mechanical strength of the match network assembly. As before, such a circuit change effectively allows shifting or stretching of the match network assembly tuning space to accommodate particular given loads (e.g., the required range or spectrum of load impedances for a particular process recipe).

Figures 13A, 13B:
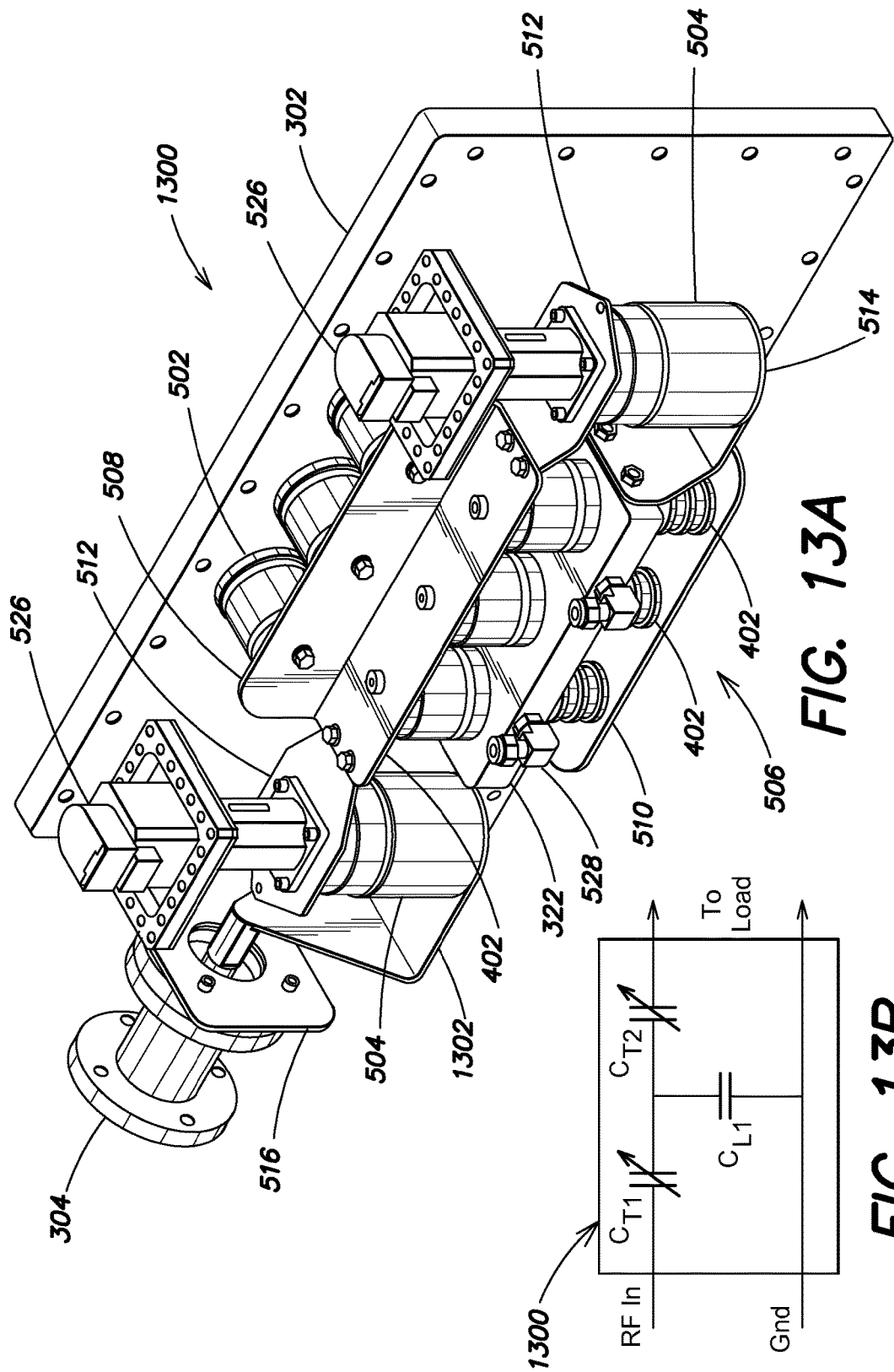
FIG. 13A is a perspective view of a sixth example configuration of a compact configurable impedance matching network assembly according to embodiments of the present invention.
FIG. 13B is a schematic diagram of the sixth example configuration of FIG. 13A.
Figure 14:
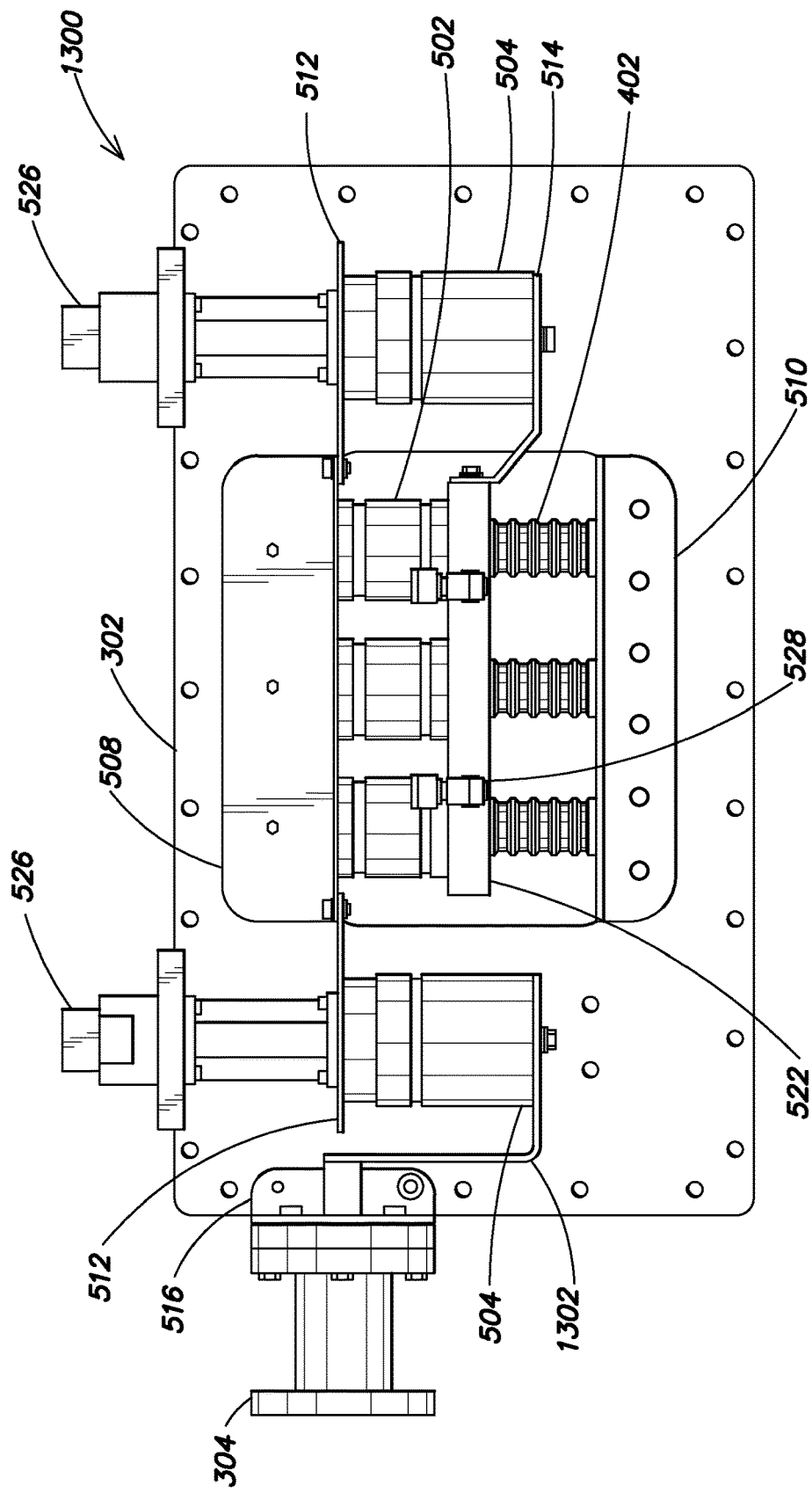
FIG. 14 is an elevation view of the sixth example configuration of FIG. 13A.

Turning now to FIGS. 13A, 13B, and 14, a seventh example configuration of the match network assembly 1300 is shown that further illustrates the flexibility and configurability of embodiments of the present invention. The match network assembly 1300 is configured in a T network topology with variable tune capacitors and a fixed load capacitor. Note that this is a different network topology than the L network of, for example, the configuration shown in FIGS. 11A and 11B. In particular, as shown in FIG. 13B (as compared to FIG. 11B), the variable load capacitor $C_{L1}$ has been changed to a fixed capacitor and a variable tune capacitor $C_{T1}$ has been added to the circuit in series with the existing variable tune capacitor $C_{T2}$ between the generator 104 and the load capacitor $C_{L1}$. Unlike conventional match networks that would require expensive component and wiring changes (if possible at all), this change from an L network topology to a T network topology can be easily, quickly, and cost effectively made in the field by merely changing the bottom connector 518 on the variable component 504 on the left hand side of the match network assembly to connect to the RF-input connector 304 instead of the output back plate 302 (and in so doing, disconnecting the RF-input connector 304 from connector 512). As before, such a circuit change effectively allows shifting or stretching of the match network assembly tuning space to accommodate particular given loads (e.g., the required range or spectrum of load impedances for a particular process recipe).

Alternatively, the Π network topology, for example, as shown in FIGS. 5A, 5B, and 6 can be easily, quickly, and cost effectively changed to an eighth example configuration of a T network topology. This can be done by merely changing the bottom connector 518 on the variable component 504 on the left hand side of the match network assembly to connect to the RF-input connector 304 instead of the output back plate 302 (and in so doing, disconnecting the RF-input connector 304 from connector 512). As before, such a circuit change effectively allows shifting or stretching of the match network assembly tuning space to accommodate particular given loads (e.g., the required range or spectrum of load impedances for a particular process recipe).

Figure 15:
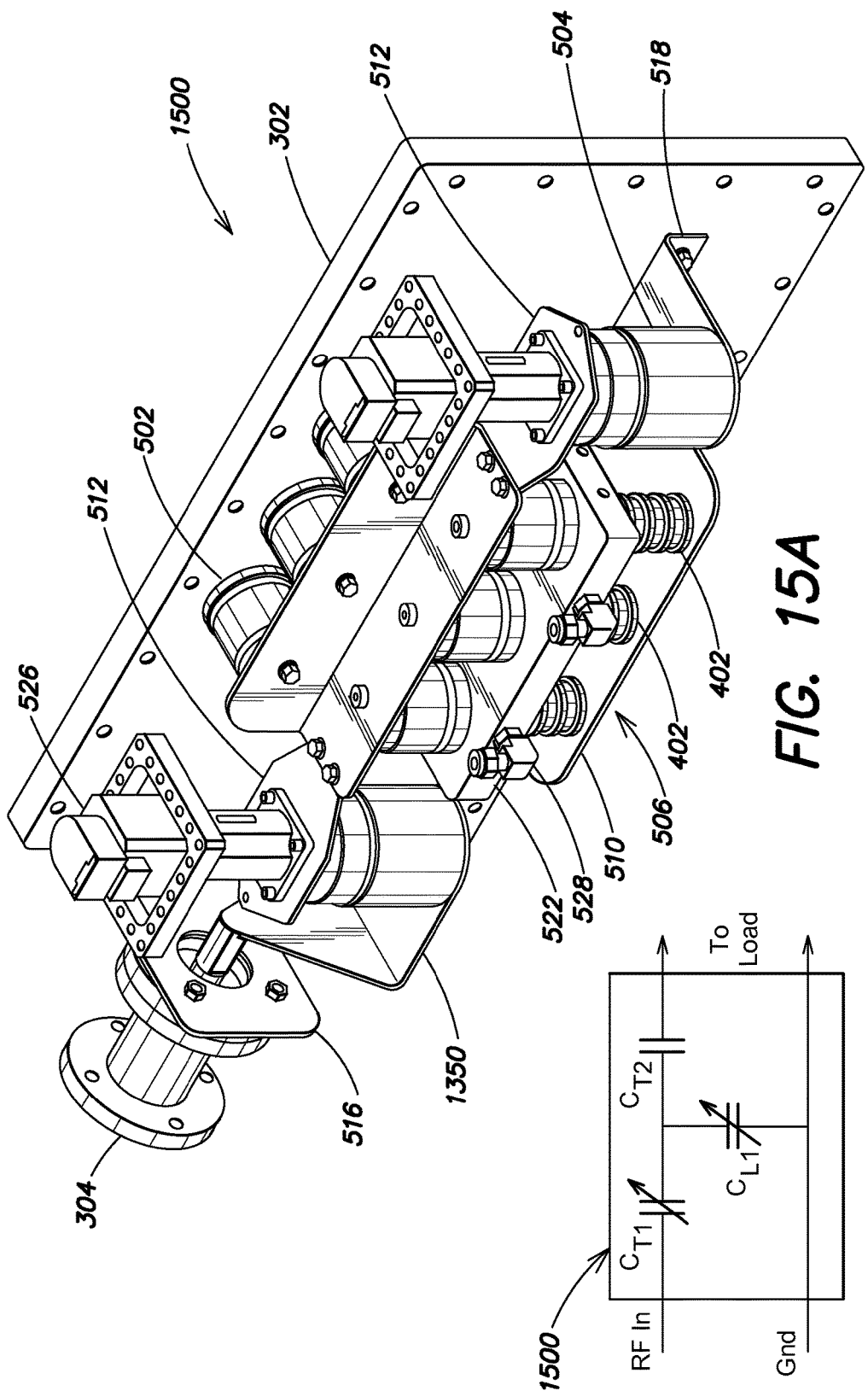
FIG. 15A is a perspective view of a seventh example configuration of a compact configurable impedance matching network assembly according to embodiments of the present invention.
FIG. 15B is a schematic diagram of the seventh example configuration of FIG. 15A.
Figure 16:
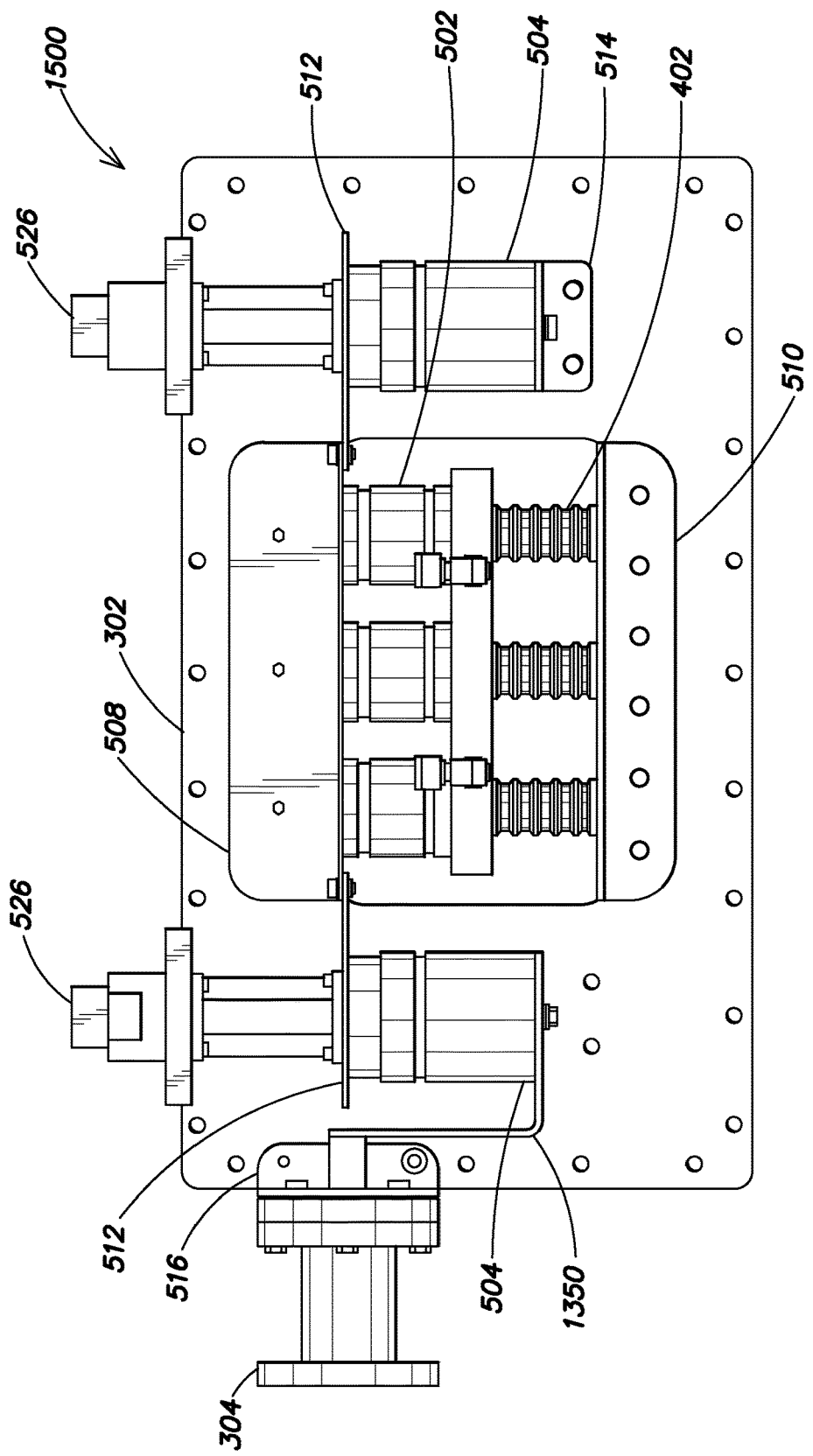
FIG. 16 is an elevation view of the seventh example configuration of FIG. 15A.

Turning now to FIGS. 15A, 15B, and 16, a ninth example configuration of the match network assembly 1500 is shown that further illustrates the flexibility and configurability of embodiments of the present invention. The match network assembly 1500 is configured in a T network topology with a variable tune capacitor $C_{T1}$, a fixed tune capacitor $C_{T2}$, and a variable load capacitor $C_{L1}$ as shown in FIG. 15B. Note that this is a different network topology than the L network of, for example, the configuration shown in FIGS. 11A and 11B. In particular, as shown in FIG. 15B (as compared to FIG. 11B), the variable tune capacitor $C_{T2}$ has been changed to a fixed capacitor and a variable tune capacitor $C_{T1}$ has been added to the circuit in series with the existing tune capacitor $C_{T2}$ between the generator 104 and the load capacitor $C_{L1}$. Unlike conventional match networks that would require expensive component and wiring changes (if possible at all), this change from an L network topology to a T network topology can be easily, quickly, and cost effectively made in the field by merely changing (a) the bottom connector 518 on the variable component 504 on the left hand side of the match network assembly to connect to the RF-input connector 304 instead of the output back plate 302 (and in so doing, disconnecting the RF-input connector 304 from connector 512) and (b) the bottom connector 514 on the variable component 504 on the right hand side of the match network assembly to connect to the output back plate 302 instead of the bus 510. As before, such a circuit change effectively allows shifting or stretching of the match network assembly tuning space to accommodate particular given loads (e.g., the required range or spectrum of load impedances for a particular process recipe).

Alternatively, the T network topology, for example, as shown in FIGS. 13A, 13B, and 14 can be easily, quickly, and cost effectively changed to an tenth example configuration of a T network topology. This can be done by merely changing the bottom connector 514 on the variable component 504 on the right hand side of the match network assembly to connect to the output back plate 302 instead of the bus 510. As before, such a circuit change effectively allows shifting or stretching of the match network assembly tuning space to accommodate particular given loads (e.g., the required range or spectrum of load impedances for a particular process recipe).

Figure 18:
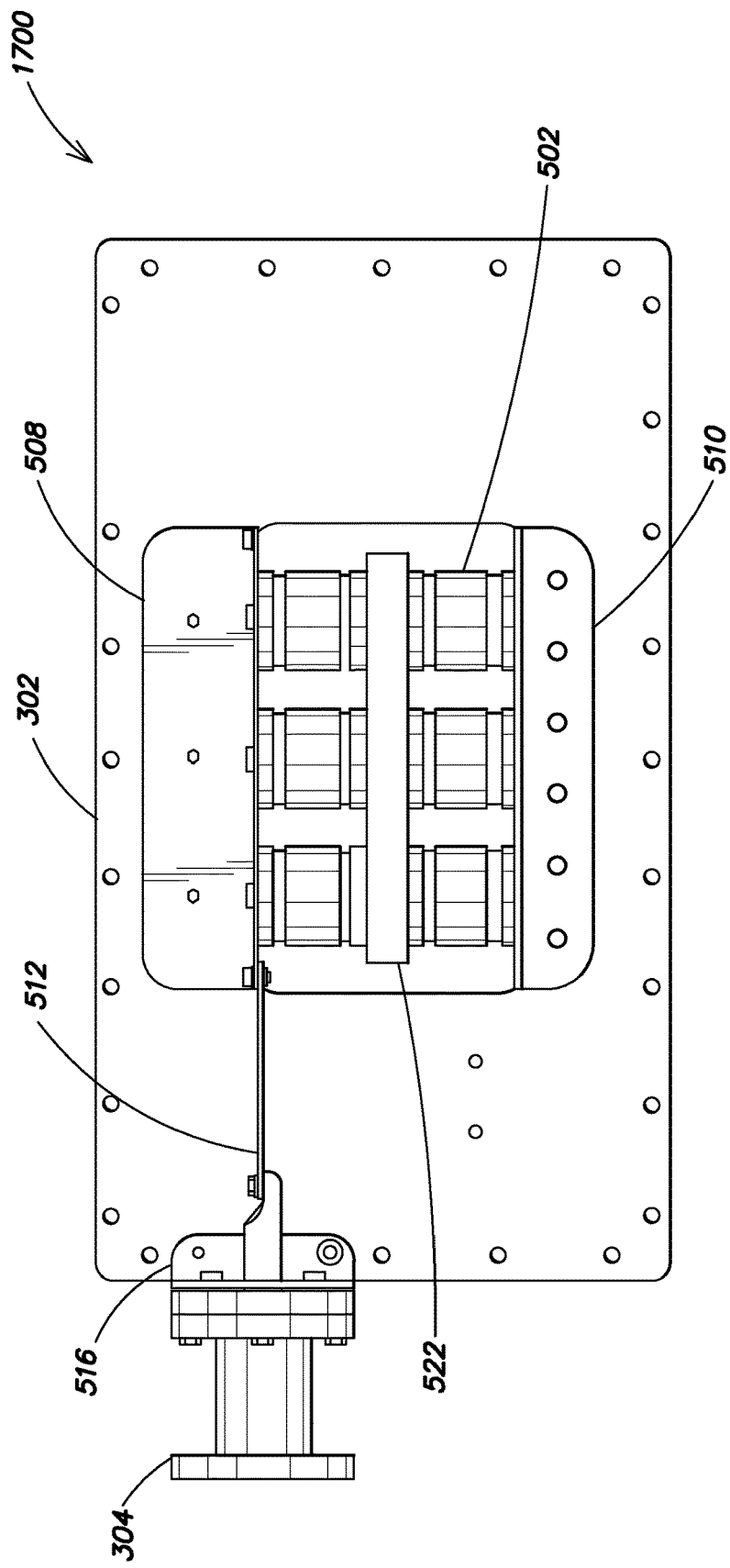
FIG. 18 is an elevation view of the eighth example configuration of FIG. 17A.

Turning now to FIGS. 17A, 17B, and 18, a eleventh example configuration of the match network assembly 1700 is shown that further illustrates the flexibility and configurability of embodiments of the present invention. A fixed match network assembly in a Π network topology without any variable capacitors is shown. This match network assembly can, in some embodiments, be sufficient for example when a variable-frequency RF generator is used and when a load-impedance range is narrow enough for the given frequency or frequency range or vice-versa, if the frequency range is wide enough for the given impedances (or impedance range). The variable/pre-set RF match configurations described above, of course, can be used with either fixed or variable-frequency generators.

Several example embodiments and configurations have been described above and illustrated in FIGS. 5A through 18. Using the same connectors 512, 514, 516, 518, buses 508, 510, and components 502, 504, many different configurations are possible and even though only a subset of possible configurations has been explicitly described, one of ordinary skill would readily understand that numerous additional configurations can be made. Further, note that many additional alternative configurations are possible by, for example, substituting insulators 402 for one or two of the components 502 on the buses 508, 510 in each of the above described topologies.

Figure 21:
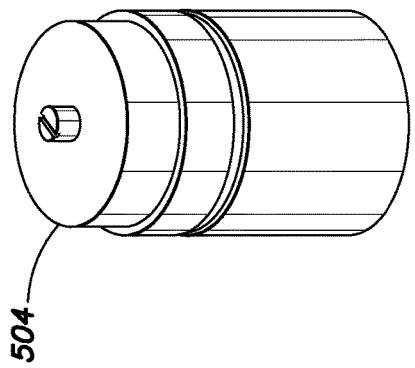
FIG. 21 is a perspective view of an example variable impedance component of a configurable impedance matching network assembly according to embodiments of the present invention.
Figure 23:
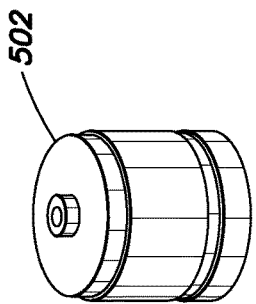
FIG. 23 is a perspective view of an example fixed impedance component of a configurable impedance matching network assembly according to embodiments of the present invention.
Figure 20:
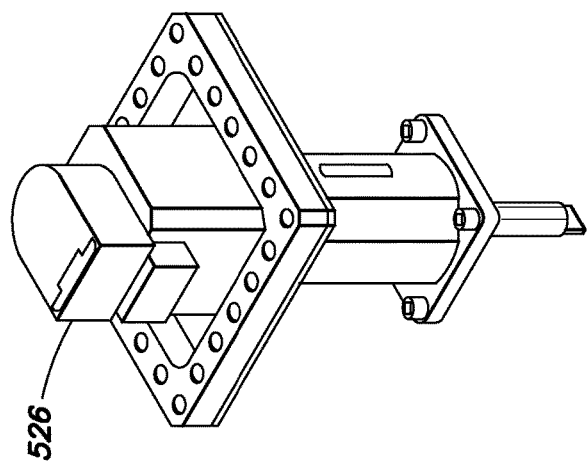
FIG. 20 is a perspective view of an example actuator of a configurable impedance matching network assembly according to embodiments of the present invention.
Figure 22:
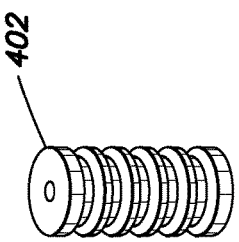
FIG. 22 is a perspective view of an example insulator of a configurable impedance matching network assembly according to embodiments of the present invention.
Figure 19:
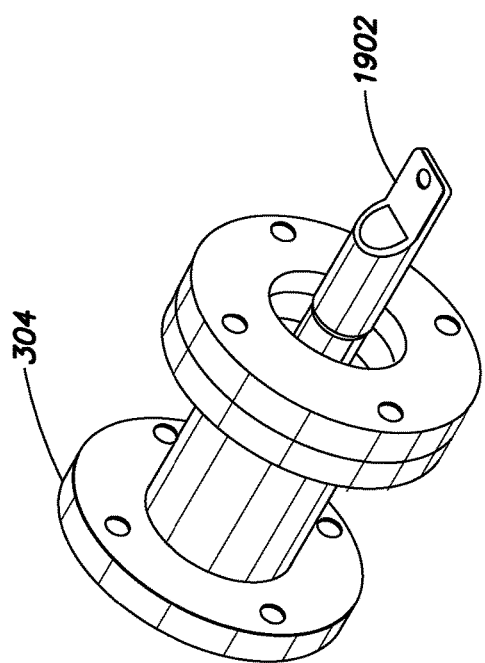
FIG. 19 is a perspective view of an example high power input connector of a configurable impedance matching network assembly according to embodiments of the present invention.
Figure 30:
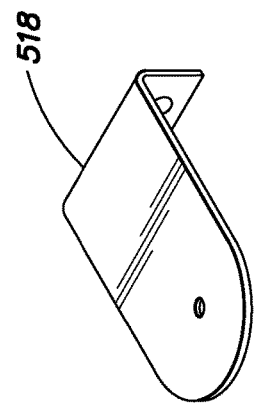
Figure 32:
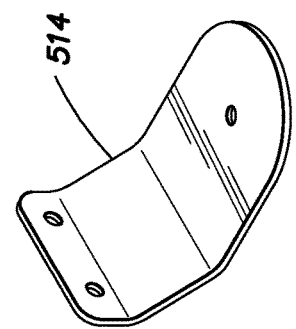
Figure 29:
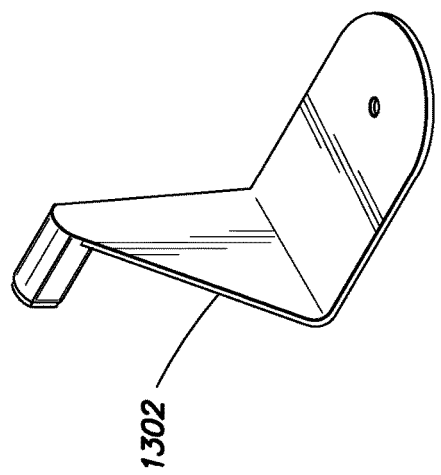
Figure 31:
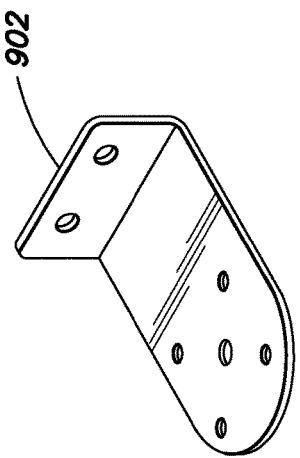

FIGS. 19 to 32 individually depict the elements shown in FIGS. 5A to 18 to more clearly illustrate each element of the match network assembly. FIG. 19 depicts an example embodiment of the high power RF-input connector 304. Removably coupled to the RF-input connector 304 is a co-axial adapter 1902 that is used to couple the RF-input connector 304 to connector 512. FIG. 20 depicts an example embodiment of the actuator 526, FIG. 21 depicts an example embodiment of the variable impedance component 504, FIG. 22 depicts an example embodiment of the insulator 402, and FIG. 23 depicts an example embodiment of the fixed impedance component 502. Note that the insulator 402 and the fixed impedance components 502 are selected to be the same height so that they are interchangeable in the match network assembly.

In some embodiments, for example, the fixed impedance component 502 can be embodied as approximately 20 mm length to approximately 100 mm length fixed vacuum capacitors in the approximately 10 pF to approximately 5000 pF range such as those manufactured by COMET AG of Flamatt, Switzerland, Meidensha Corporation of Tokyo, Japan, or Jennings Technology Co. of San Jose, Calif. In some embodiments, fixed capacitors of approximately 52 mm length can be used that are rated at approximately 250 pF, approximately 350 pF, or approximately 500 pF; approximately 3 kVp to approximately 30 kVp; and approximately 100 A rms.

In some embodiments, for example, the variable impedance component 504 can be embodied as approximately 50 mm length to approximately 200 mm length variable capacitors in the approximately 100 pF to approximately 5000 pF range such as those manufactured by Meidensha Corporation of Tokyo, Japan, and COMET AG of Flamatt, Switzerland, or Jennings Technology Co. of San Jose, Calif. In some embodiments, variable capacitors of approximately 100 mm length can be used that are rated at approximately 50 pF to approximately 1000 pF; approximately 5 kVp to approximately 15 kVp; and approximately 100 A rms.

FIG. 24 depicts an example embodiment of the connector 516 used to couple the ground shield of the high power RF-input connector 304 to the output back plate 302. FIG. 25 depicts an example embodiment of bus 508 and FIG. 26 depicts an example embodiment of bus 510. Note that the buses 508, 510 as well as other connectors can be constructed of flexible conductors (e.g., sheet metal) to accommodate variations in component length due to manufacturing tolerances when the components are attached to them. FIG. 27 depicts an example embodiment of an optional reinforcing bar 2702 which is adapted to couple to bus 510 to provide rigidity to a portion of bus 510 and insure a flush coupling of the bus 510 to the output back plate 302. In some embodiments, reinforcing bar 2702 can be formed integral to bus 510.

FIGS. 28 to 32 depict example embodiments of connectors 512, 1302, 518, 902, and 514 respectively. Note that the buses 508, 510 and the connectors 512, 1302, 518, 902, 514 each include hole patterns adapted to allow coupling to at least two of (a) the components 502, 504, (b) the insulators 402, (c) the co-axial adapter 1902, (d) the output back plate 302, and (e) the RF output strap 522. Also note that in some embodiments, connectors 518, 902, and 514 can be replaced by a single connector including hole patterns to function as any of connectors 518, 902, and 514. This replacement would reduce the number of unique connectors 512, 1302, 518, 902, and 514 used to make the various different configurations described above, from five types of connectors to just three types (e.g., connectors 512, 1302 and the new connector). Likewise, in some embodiments, the buses 508, 510 can be replaced with a single bus part that includes hole patterns that allow the single bus part to serve as both buses 508 and 510, thereby further reducing the unique part count.

Although the above described example embodiments use capacitors as the components 502, 504, in alternative embodiments, the components can include inductors and/or combinations of capacitors, inductors, and/or resistors. For example, in some embodiments, one or more of the fixed impedance components 502 can be replaced with a modular circuit contained in a form factor adapted to fit in place of the fixed impedance components 502 in the match network assembly.

As indicated above, the inclusion of variable impedance components 504 allows significant expansion of the tuning space (i.e., the domain and range over which the match network assembly can be adjusted to match the source and load impedances). Continuing developments in chemical vapor deposition (CVD) process and clean steps and recipes, as well as in process chamber hardware, have led to larger ranges of load impedances to be matched in order to efficiently couple RF power to the loads while maintaining the stability of the RF generator and avoiding load-power alarm conditions.

By providing the ability to quickly, easily, cost effectively, and efficiently change impedance and match topology configurations and thus, tuning space, embodiments of the present invention avoid cable-length issues and reduce the number of fixed capacitors used. In addition, fewer types of capacitors are required which reduces the inventory of capacitors an operator would have to maintain, thereby reducing the operating costs. For example, using a Π network topology according to embodiments of the present invention, since the RF current to the load flows through two branches, the current ratings per capacitor bank can be smaller which means fewer capacitors are needed than conventional arrangements and less total capacitance is needed.

Further, the compact component array of embodiments of the invention minimizes RF current paths which means lower series inductance and thus, lower RF driving voltages, lower risk of arcing, and potentially lower RF power loses too. Further, the compact component array of embodiments of the invention results in a smaller overall footprint than prior art match networks which allows the match network assembly and the RF generator to be mounted on the lid of the plasma chamber, further shortening RF current paths. In some embodiments, the match network assembly is compact enough such that the assembly can be implemented within an enclosure that is approximately 20" wide by approximately 11" deep by approximately 14" tall. Other smaller dimensions are possible.

Figure 33:
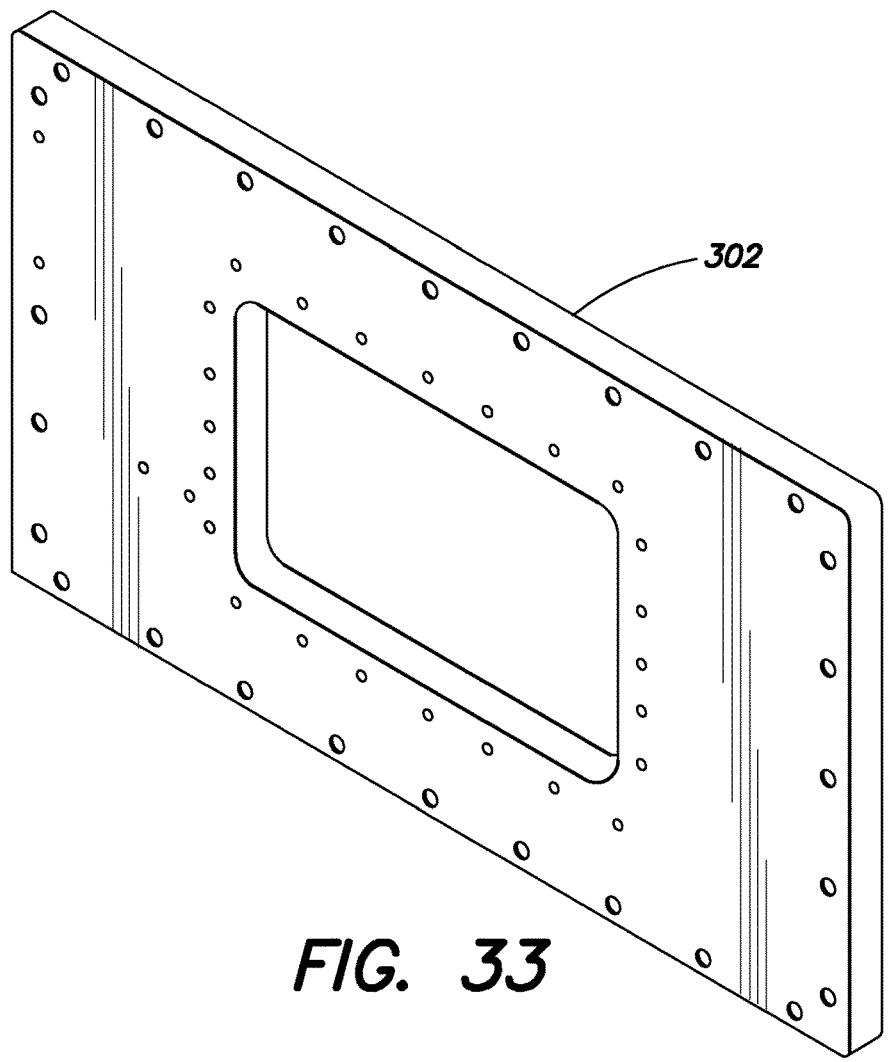
FIG. 33 is a perspective view of an example output back plate of a configurable impedance matching network assembly according to embodiments of the present invention.
Figure 34:
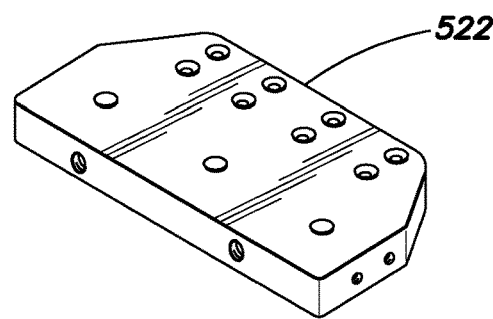
FIG. 34 is a perspective view of an example RF output strap of a configurable impedance matching network assembly according to embodiments of the present invention.

FIG. 33 depicts an example embodiment of the output back plate 302 and FIG. 34 depicts an example of the RF output strap 522. The output back plate 302 includes hole patterns for supporting various elements of the match network assembly, for coupling to the enclosure, and for coupling to the plasma processing chamber. The output back plate 302 also includes a window that provides access to the RF output strap 522 as well as an opening for exhausting air blown by the components 502, 504. In some embodiments, the output back plate 302 is made from a heat conductive material and dimensioned to function as a heat sink. For example, in some embodiments, the output back plate 302 is made from aluminum (Al) plate approximately 20" wide by approximately 12" tall by approximately 0.8" thick with the opening for the RF output strap 522 being approximately 9" wide by approximately 5" tall. In some embodiments, the RF output strap 522 is made from 0.8" thick copper (Cu) coated with silver (Ag) plating. In other embodiments, the RF output strap 522 and back plate 302 are made from aluminum (Al) or any practicable metal or conductor. In addition, other thicknesses and dimensions for the RF output strap 522 and back plate 302 can be used. In some embodiments, the output back plate 302 can include cooling fluid channels.

Accordingly, while the present invention has been disclosed in connection with exemplary embodiments thereof, it should be understood that other embodiments may fall within the spirit and scope of the invention, as defined by the following claims.

The invention claimed is:

1. A radio frequency (RF) matching network assembly for matching RF energy output from an RF generator to a plasma chamber with a variable impedance load, the RF matching network assembly comprising:
an enclosure having an output back plate that forms a wall of the enclosure;
an input connector;
an output connector; and
a compact configurable component assembly array enclosed in the enclosure and mounted on the output back plate, the component assembly array including one or more tune and load electrical components,
wherein at least one of the tune and load electrical components is coupled to the input connector, at least one of the tune and load electrical components is coupled to the output connector, the component assembly array is adapted to be arranged in a plurality of network topologies using a fixed number of buses and configurable connectors, the network topologies including a selected network topology adapted to reduce RF energy reflected from the variable impedance load; and
wherein the plurality of network topologies include L, inverse-L, T, and Π network topologies.

2. The RF matching network assembly of claim 1 wherein the component assembly array includes two buses and a fixed set of configurable connectors.

3. The RF matching network assembly of claim 2 wherein the two buses are each adapted to couple to a bank of fixed impedance components and the fixed set of configurable connectors is adapted to enable configuration of the component assembly array in the plurality of network topologies including the selected network topology.

4. The RF matching network assembly of claim 2 wherein the two buses are flexible and each is adapted to couple to a bank of fixed impedance components and the fixed set of configurable connectors is adapted to enable configuration of the component assembly array in the plurality of network topologies including the selected network topology.

5. The RF matching network assembly of claim 1 wherein the output connector includes an RF output strap, and the output back plate includes an opening for access to the RF output strap.

6. The RF matching network assembly of claim 5 wherein the RF output strap includes channels for fluid cooling.

7. The RF matching network assembly of claim 6 wherein the tune and load electrical components of the component assembly array are immediately adjacent to each other so as to minimize a length of RF current flow.

8. A plasma processing system comprising:
an RF generator;
an impedance match network assembly coupled to the RF generator; and
a plasma chamber with a variable impedance load coupled to the impedance match network assembly,
wherein the impedance match network assembly includes an enclosure, an input connector, an output connector, and a compact configurable component assembly array enclosed in the enclosure and mounted to an output back plate that forms a wall of the enclosure, the component assembly array including one or more tune and load electrical components,
wherein at least one of the tune and load electrical components is coupled to the input connector, at least one of the tune and load electrical components is coupled to the output connector, the component assembly array is adapted to be arranged in a plurality of network topologies using a fixed number of buses and configurable connectors, the network topologies including a selected network topology adapted to reduce RF energy reflected from the variable impedance load; and
wherein the plurality of network topologies include L, inverse-L, T, and Π network topologies.

9. The plasma processing system of claim 8 wherein the component assembly array includes two buses and a fixed set of configurable connectors.

10. The plasma processing system of claim 9 wherein the two buses are each adapted to couple to a bank of fixed impedance components and the fixed set of configurable connectors is adapted to enable configuration of the component assembly array in a plurality of different network topologies including the selected network topology.

11. The plasma processing system of claim 10 wherein the output connector includes an RF output strap.

12. The plasma processing system of claim 11 wherein the output back plate includes an opening for access to the RF output strap.

13. The plasma processing system of claim 12 wherein the RF output strap includes channels for fluid cooling.

14. The plasma processing system of claim 13 wherein the tune and load electrical components of the component assembly array are immediately adjacent to each other so as to minimize a length of RF current flow.

15. A method of matching RF energy output from an RF generator to a plasma chamber with a variable impedance load, the method comprising:
receiving RF power at an input connector;
applying the RF power to a compact configurable component assembly array enclosed in an enclosure and mounted to an output back plate that forms a wall of the enclosure, the component assembly array including one or more tune and load electrical components;
outputting the RF power to the plasma chamber via an output connector with an impedance that matches the variable impedance load of the plasma chamber,
wherein at least one of the tune and load electrical components is coupled to the input connector, at least one of the tune and load electrical components is coupled to the output connector; and
arranging the component assembly array in a selected network topology configuration selected from among a plurality of possible network topology configurations all of which can be assembled using the component assembly array wherein the selected network topology configuration is adapted to reduce RF energy reflected from the variable impedance load; and
wherein the plurality of possible network topology configurations include L, inverse-L, T, and Π network topologies.

16. The method of claim 15 wherein arranging the component assembly array includes arranging a fixed set of configurable connectors to couple two flexible buses to the input and output connectors.

17. The method of claim 16 further including coupling each of the buses to a bank of fixed impedance components and coupling the fixed set of configurable connectors to the two flexible buses to configure the component assembly array into the selected network topology from among the plurality of possible network topology configurations.

18. The method of claim 17 wherein outputting the RF power to the plasma chamber includes coupling the output back plate and an RF output strap to the plasma chamber.

19. The method of claim 18 wherein coupling RF output strap to the plasma chamber includes accessing the RF output strap via an opening in the output back plate.

20. The method of claim 19 wherein arranging the component assembly array in the selected network topology configuration includes arranging the tune and load electrical components of the component assembly array to be immediately adjacent to each other so as to minimize a length of RF current flow.

* * * * *